United States Patent [19]

Zumoto et al.

[11] Patent Number: 5,310,986
[45] Date of Patent: May 10, 1994

[54] LASER MACHINING APPARATUS

[75] Inventors: Nobuyuki Zumoto; Toshinori Yagi; Masao Izumo; Masaaki Tanaka, all of Hyogo, Japan

[73] Assignee: Mitsubishi Denki Kabushiki Kaisha, Tokyo, Japan

[21] Appl. No.: 52,897

[22] Filed: Apr. 26, 1993

[30] Foreign Application Priority Data

Apr. 28, 1992 [JP] Japan ................................ 4-109403
Feb. 24, 1993 [JP] Japan ................................ 5-35306

[51] Int. Cl.$^5$ ............................................. B23K 26/00
[52] U.S. Cl. ..................... 219/121.7; 219/121.68; 219/121.74
[58] Field of Search ................. 219/121.68, 121.65, 219/121.73, 121.74, 121.7, 121.71

[56] References Cited

U.S. PATENT DOCUMENTS 5,223,693  6/1993  Zumoto et al. ................ 219/121.68

FOREIGN PATENT DOCUMENTS 63-220991  9/1988  Japan .
3-94989    4/1991  Japan .
3-210987   9/1991  Japan .
4-356392  12/1992  Japan .

*Primary Examiner*—C. L. Albritton
*Attorney, Agent, or Firm*—Wolf, Greenfield & Sacks

[57] ABSTRACT

A laser machining apparatus comprises a mask, a reflecting mirror and an imaging optical system. The laser light reflected by the mask and also by the reflecting mirror passes through the mask and images on the work for machining the work. The laser machining apparatus comprises means for causing said mask to move in parallel with said work for machining the work. This laser machining apparatus is able to machine a work having a large surface using small apertured mask. Another type of laser machining apparatus comprises a mask and a platform and an imaging optical system. The mask and the work are puts in the same plane of the platform and driven so that the image of the mask is mapped on the work via the imaging optical system. The laser machining apparatus is able to machine a large area at low price and high accuracy.

17 Claims, 24 Drawing Sheets

LASER MACHINING APPARATUS

FIELD OF THE INVENTION

The present invention relates to a laser machining apparatus for machining via-holes through a printed circuit board by the use of laser light and a mask.

DESCRIPTION OF THE PRIOR ART

A laser machining apparatus of this type is disclosed, for example, in the laid-open patent publication No. 3-210987. The disclosed laser machining apparatus improves the efficiency of use of the laser light. The principle of the laser machining apparatus is generally explained by referring to FIG. 16. The numeral 1 is a laser light which is generated by excimer laser. The numeral 2 is a mask. A reflecting mirror 3 is arranged to be parallel with the mask 2 and to be separated from it by an appropriate distance. The numeral 4 is a imaging lens. The numeral 5 is a work which is to be machined, for example, a printed circuit board made of polyimide. The mask 2 comprises a reflecting portion 2B characterized by a high reflectance and comprised of an aluminum reflecting coating or a dielectric multi-layer coating. The reflecting portion 2B is created by depositing a predetermined pattern on the light transmission substrate 2A which is made of synthetic fused silica and which allows the laser light 1 to pass through the mask 2. The deposited pattern has a plurality of holes having a diameter of about 20 $\mu$m which comprise a light transmitting portion 2C where the laser light passes through.

In FIG. 16, the laser light 1 is irradiated obliquely from the upper portion onto the upper end portion of the mask 2. A part of the laser light 1 passes through the transmitting portion 2C and operates on the work 5 to machine a via-hole, and the remaining light is reflected at the reflecting portion 2B and again irradiates the mask 2 after being reflected at the reflecting mirror 3. The light irradiated on the reflecting portion 2B for the second time deviates from the position irradiated for the first time. This reflection and irradiation process is repeated many times until the laser light reaches either the end portion of the mask 2 or the end of the reflecting mirror 3. As a result, the laser light 1 is reflected many times between the reflecting portion 2B and the reflecting mirror 3 maintains substantially the same light intensity. The light which is passed through the transmitting portion 2C is imaged by the imaging lens 4 on the work 5 and machines the via-holes 6 corresponding to the pattern of the light transmitting portion 2C of mask 2.

In the above conventional laser machining apparatus, the machining area is restricted to the illumination pattern of the optical system. Therefore, there is a problem that an area larger than the area irradiated by the laser light can not be machined. In the conventional optical system, it is necessary to change the shape of laser beam 1, the size of mask 2, the size of the reflecting mirror 3 and the imaging lens 4 in order to machine a larger work. The problem is that the manufacturing cost increases as these changes are more or the optical system can no longer be realized, especially, where the imaging lens 4 requires a large diameter.

FIG. 30 is one of the constructions of laser machining apparatus which was proposed of late by the same inventors. In the figure, the laser beam 22 from thelight source is irradiated only on a part of the mask 2. The laser light 21 which is passed through the mask 2 passes through the imaging lens 51 and projects the mask pattern on the work 5. The laser light 1 which is imaged by the imaging lens 51 machines the work 5 according to the mask pattern. The mask 2 and the work 5 are moved synchronously in the X and Y directions using step-wise driving or step & scan driving technique so that eventually the whole area of the work 5 is machined.

In a laser machining apparatus for perforating a small hole pattern having a diameter on the order of several tens of $\mu$m, the accuracy of the hole diameter depends on the distortion quantity of the machining imaging lens 51 and also the synchronous driving accuracy between the mask 2 and the work 5. Therefore, it is necessary to provide high accuracy X-Y driving stages for driving the mask 2 and the work 5 synchronously and also to provide different individual driving stages for driving the mask 2 and the work 5. Accordingly, there are problems in that the laser machining apparatus has low machining accuracy and may also become very expensive.

Accordingly, it is an object of the present invention to provide a laser machining apparatus for machining a larger area than actually irradiated by the optical system itself and for increasing the stability of the reflecting optical system instead of the deviation of mask setting angle, by causing the mask, the work, both the mask and the work, the multiple reflection optical system or the objective lens to move.

It is another object of the present invention to provide a laser machining apparatus for decreasing the variation of the light intensity by using a cylindrical concave mirror or a spherical concave mirror during driving of the optical system and for carrying out more homogeneous machining.

It is further object of the present invention to provide a laser machining apparatus for decreasing the variation of the intensity distribution by drifting of the light and for attaining high stability of the reflecting optical system by detecting the light intensity and maintaining the angle constant between the mirror and the mask.

It is a further object of the present invention to provide a laser machining apparatus for driving the mask and the work in the same plane or in two separate planes at a desired speed ratio.

It is further object of the present invention to provide an inexpensive laser machining apparatus for attaining a high accuracy driving system without causing synchronous deviation and without having high accurate control system for the driving system.

SUMMARY OF THE INVENTION

According to one aspect of the present invention, there is provided a laser machining apparatus which comprises a mask having light transmitting portions which causes a laser light received from a light source to pass through and reflecting portions which causes said laser light to reflect, a reflecting mirror, mounted substantially in parallel with said mask and separated by a predetermined distance from said mask, which causes the laser light received from the reflecting portions of the mask to reflect back towards said mask, and an imaging optical system, for machining a work by the laser light which passes through the light transmitting portions of the mask, comprising: a means for causing said mask to move in parallel with said work for machining the work.

According to another aspect of the present invention, there is provided a laser machining apparatus comprises a mask having light transmitting portions which allow laser light received from a light source to pass through and reflecting portions which reflect said laser light, a reflecting mirror, mounted substantially in parallel with said mask and separated by a predetermined distance from said mask, which causes the laser light received from the reflecting portions to reflect back towards said mask, and an imaging optical system, for machining a work by the laser light which passes through the light transmitting portions of the mask, comprising: a means for causing said work to move in parallel with said mask for machining the work.

According to another aspect of the present invention, there is provided a laser machining apparatus comprising a mask having light transmitting portions which allow a laser light received from a light source to pass through and reflecting portions which reflect said laser light, a reflecting mirror, mounted substantially in parallel with said mask and separated by a predetermined distance from said mask, which causes the laser light received from the reflecting portions to reflect back towards said mask, and an imaging optical system, for machining a work by the laser light which passes through the light transmitting portions of the mask, comprising: a means for causing said mask and said work to move synchronously and in parallel with each other for machining the work.

A laser light machining apparatus preferably comprising a cylindrical concave mirror mounted at an opposite side of the mask as the reflecting mirror.

A laser light machining apparatus preferably comprising a concave mirror mounted at the opposite side of the mask as the reflecting mirror.

According to another aspect of the present invention, there is provided a laser machining apparatus comprising a mask having light transmitting portions which allow a laser light received from a light source to pass through and reflecting portions which reflect said laser light, a reflecting mirror, mounted substantially in parallel with said mask and separated by a predetermined distance from said mask, which causes the laser light received from the reflecting portions to reflect back towards said mask, and an imaging optical system, for machining a work by the laser light which passes through the light transmitting portions of the mask, comprising: a means for causing a multiple reflection optical system comprised of the mask and the reflecting mirror and an imaging optical system to move the mask and reflecting mirror in parallel with each other for machining the work.

According to another aspect of the present invention, there is provided a laser machining apparatus comprises a mask having light transmitting portions which allow a laser light received from a light source to pass through and reflecting portions which reflect said laser light, a reflecting mirror, mounted substantially in parallel with said mask and separated by a predetermined distance from said mask, which causes the laser light received from the reflecting portions to reflect back towards said mask, and an imaging optical system, for machining a work by the laser light which passes through the light transmitting portions of the mask, a laser machining apparatus for maintaining the light intensity to be constant, comprising: a means for moving the mask in parallel with the work; a measuring means, mounted at the opposite side of the mask, for measuring the light intensity of the laser light irradiated on the reflecting mirror via the mask; an angle regulating means for regulating the angle between the reflecting mirror and the mask; a controlling means for controlling said angle regulating means in response to said light intensity.

According to another aspect of the present invention, there is provided a laser machining apparatus, comprising: a mask which has transmitting portions which allow laser light from light source to pass through and reflecting portions which reflect the laser light from the light source; an imaging optical system which causes the mask pattern to image on the work surface which is in the same plane of the mask surface.

According to another aspect of the present invention, there is provided a laser machining apparatus, further comprising: a platform on which the mask and the work are located in the same plane.

According to another aspect of the present invention, there is provided a laser machining apparatus, further comprising: a first driving means for causing said platform to rotate around a first rotating axis which is perpendicular to the platform plane.

According to another aspect of the present invention, there is provided a laser machining apparatus, further comprising: a second driving means for causing said platform to move fore and aft along a second axis which is perpendicular to the first rotating axis.

According to another aspect of the present invention, there is provided a laser machining apparatus, comprising:

a mask which has transmitting portions which allow the laser light from the light source to pass through and reflecting portions which reflect the laser light from the light source; a first X-Y stage for mounting the mask thereon; a second X-Y stage which is located in the same plane as the first X-Y stage for mounting the work thereon; an imaging optical system which causes the laser light which is passed through said transmitting portions of the mask to create an image in the same plane where the mask is located.

According to another aspect of the present invention, there is provided a laser machining apparatus, comprising: a mask which has transmitting portions which allow the laser light from the light source to pass through and reflecting portions which reflect the laser light from the light source; a connection pantograph which causes the mask and the work to be mounted in parallel at a specified distance in the same plane; an imaging optical system which causes the laser light which has passed through said transmitting portions of the mask to image on the work in the same plane where the mask is located.

DETAILED DESCRIPTION OF THE PREFERRED EMBODIMENTS

Embodiment 1

Figure 1:
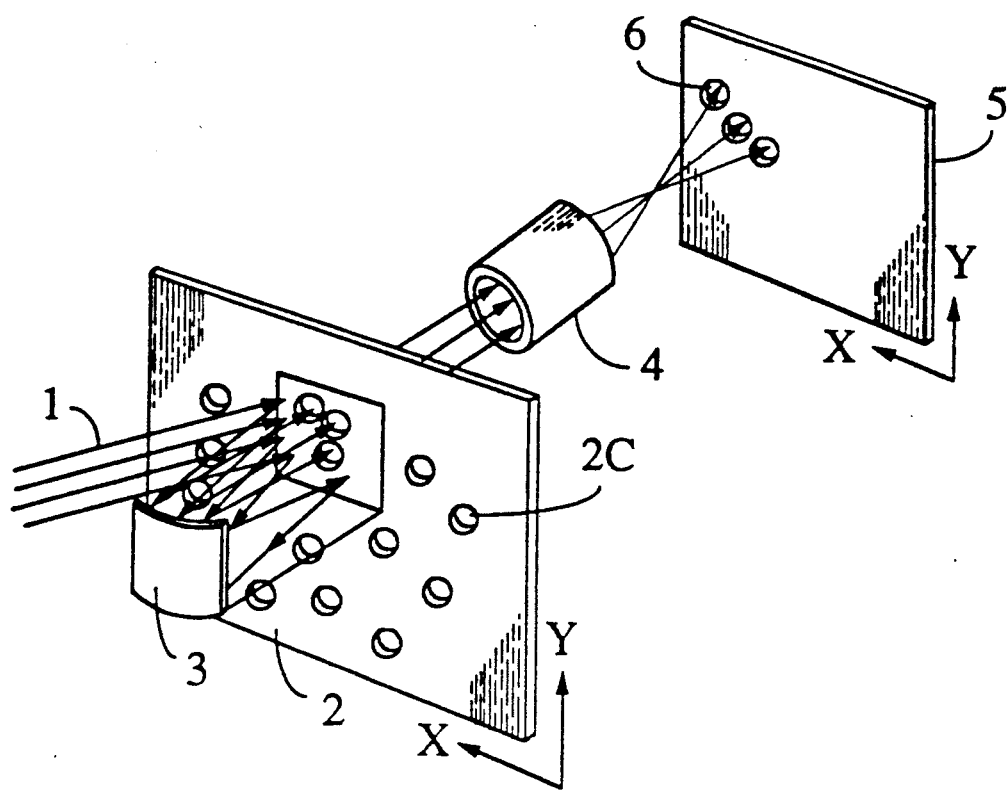
FIG. 1 is a perspective view of an embodiment of the present invention in which a laser machining apparatus machines via-holes in the printed circuit board.
Figure 2A:
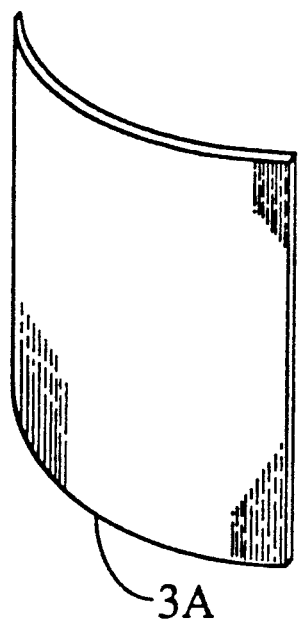
FIG. 2A and FIG. 2B are perspective views of a cylindrical concave mirror and a spherical concave mirror.
Figure 2B:
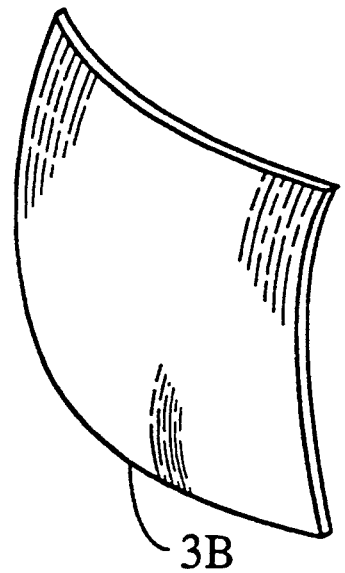
Figure 16:
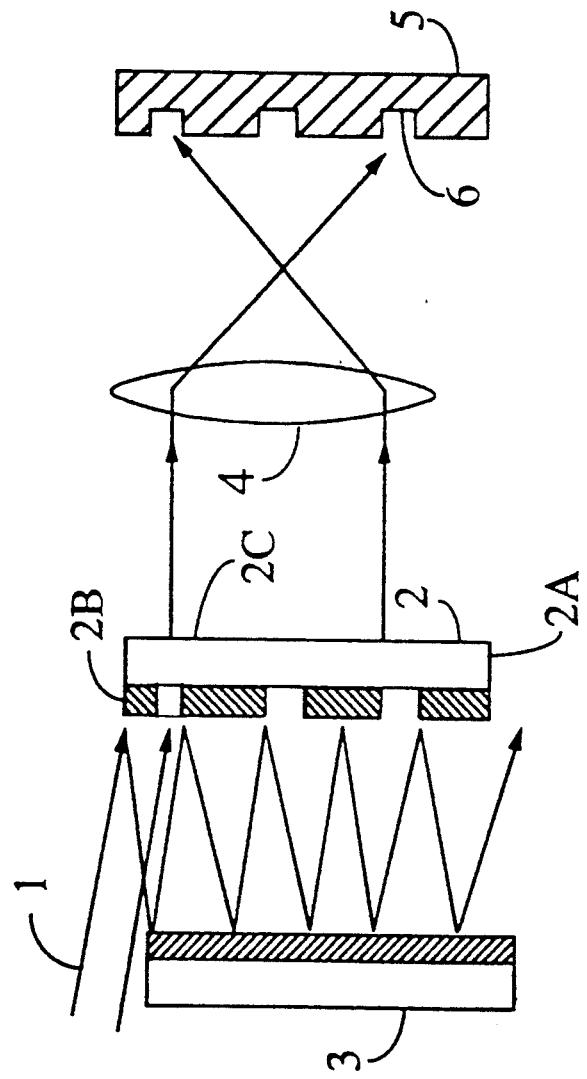
FIG. 16 illustrates a conventional laser machining apparatus.

The first embodiment of the present invention is described according to FIG. 1 to FIG. 3. FIG. 1 is a perspective view of a first embodiment of the present invention in which a laser machining apparatus machines via-holes in the printed circuit board. FIG. 2A and FIG. 2B are perspective views of a cylindrical concave mirror and a spherical concave mirror. The reference numbers in FIG. 1 ~ FIG. 3 are the same as those in FIG. 16 for the same structures in the corresponding Figures. Accordingly, the detailed explanation is omitted in connection with the same reference numbers.

In the first embodiment of FIG. 1, the mask 2 and the work 5 move synchronously in both the X direction and Y directions. The cylindrical concave mirror 3A shown in FIG. 2A is used as the reflecting mirror 3, and other constructions are similar to those in FIG. 16. The spherical concave mirror 3B shown in FIG. 2B may also be used as the reflecting mirror 3 instead of the cylindrical concave mirror 3A shown in FIG. 2A.

The operation of the above construction of the laser machining apparatus is explained here. The laser light 1 irradiates obliquely from upper side to the upper end portion of the mask 2 which has a reflectance of more than 90%. The laser light 1 irradiated at mask 2 repeats the reflection between the mask 2 and the reflecting mirror 3 and moves from the upper portion to the bottom portion of the mask 2. During the movement, the laser light 1, which passes through the light transmitting portion 2C of the mask, which comprises a plurality of small holes, forms an image on the work 5 via the imaging lens 4 and machines via-holes 6 into the work 5 in the same way as the conventional apparatus. The angle which the laser light 1 irritates the mask 2 is set so that the laser light reflected at the reflecting mirror 3 irradiates the whole mask surface.

Figure 17B:
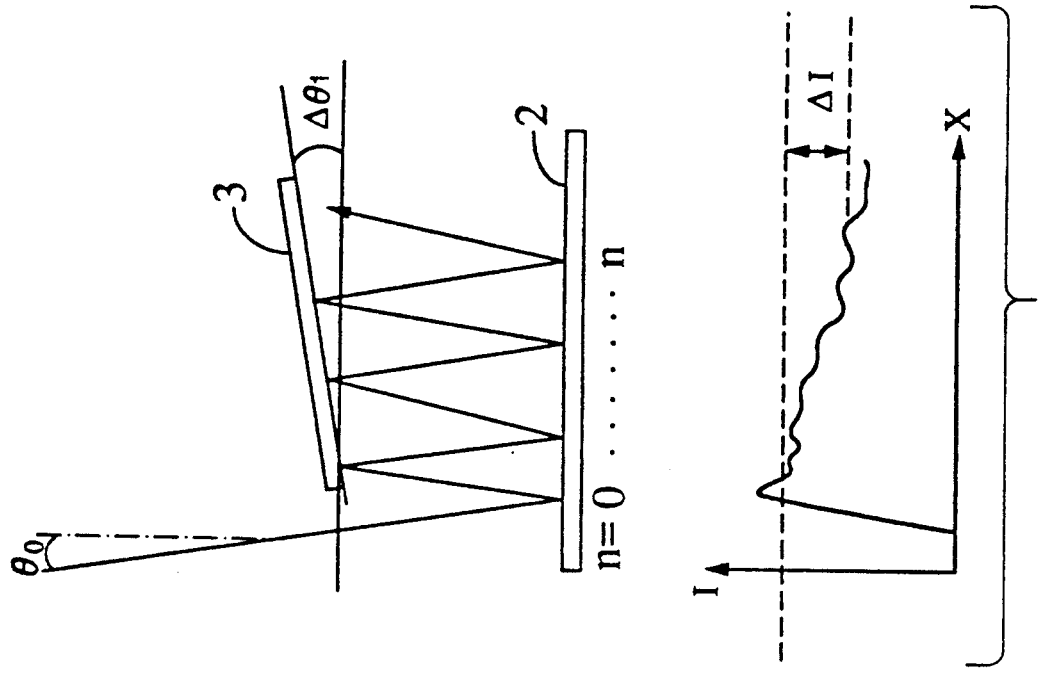
FIG. 17A and FIG. 17B depict the variations of the light intensity of the conventional laser machining apparatus.
Figure 17A:
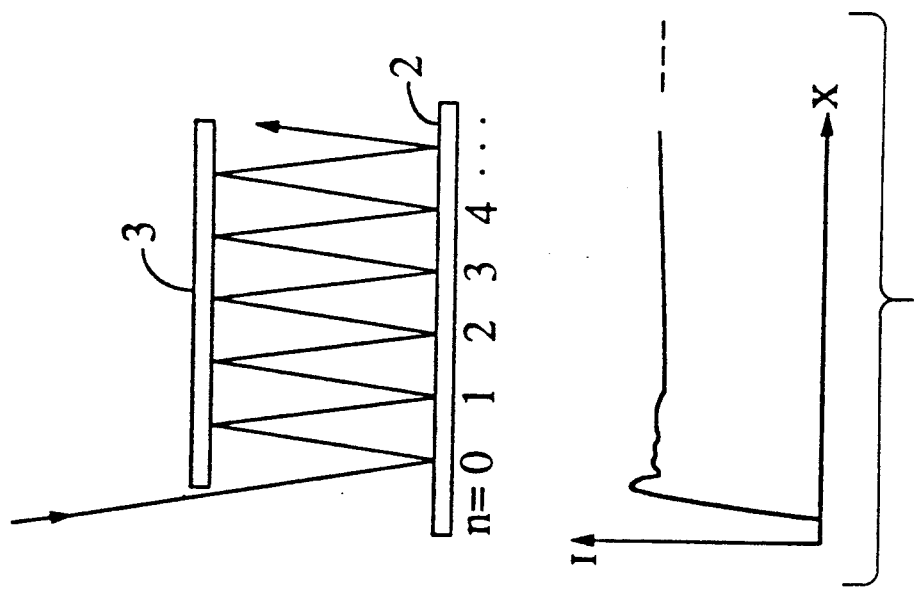

Since the embodiment of the present invention uses the cylindrical concave mirror 3A as the reflecting mirror, the stability of the multireflection optical system for variations of the mask setting angle is increased and the variation of the light intensity is decreased. That is, the angle between the mask and the reflecting mirror varies in case the flatness of the mask 2 is not perfect. Therefore, for the case where the laser machining apparatus uses the conventional flat mirror, the multiple reflection condition of the laser light results in a decreased light intensity distribution of the light. FIG. 17A and FIG. 17B show the variations of the light intensity of the conventional laser machining apparatus using the conventional flat mirror.

FIG. 17A shows a case where the mask 2 is parallel with the reflecting mirror 3 and FIG. 17B shows a case where the relative angle of the mask is inclined by $\theta_1$ from the reflecting mirror. In this case, the variation of the light intensity corresponding to the variation of the relative angle is approximately expressed as follows.

$$\Delta I/I = -1.\theta_o \cdot (2n+1) \cdot \Delta\theta_1$$

where,

I is the light intensity on the mask, $\theta_o$ is the beam incident angle against the normal line of the mask surface, n is the multiple reflection number, $\Delta\theta_1$ is the variation of relative angle.

By way of example, assume that $\theta_o = 12$ mrad, n = 10, $\Delta\theta_1 = 200$ μrad, then $\Delta I/I = 0.35$. That is, the light intensity varies about 35%. The variation in light intensity on the mask results in a inhomogeneous machining of the via holes.

Figures 3A, 3B:
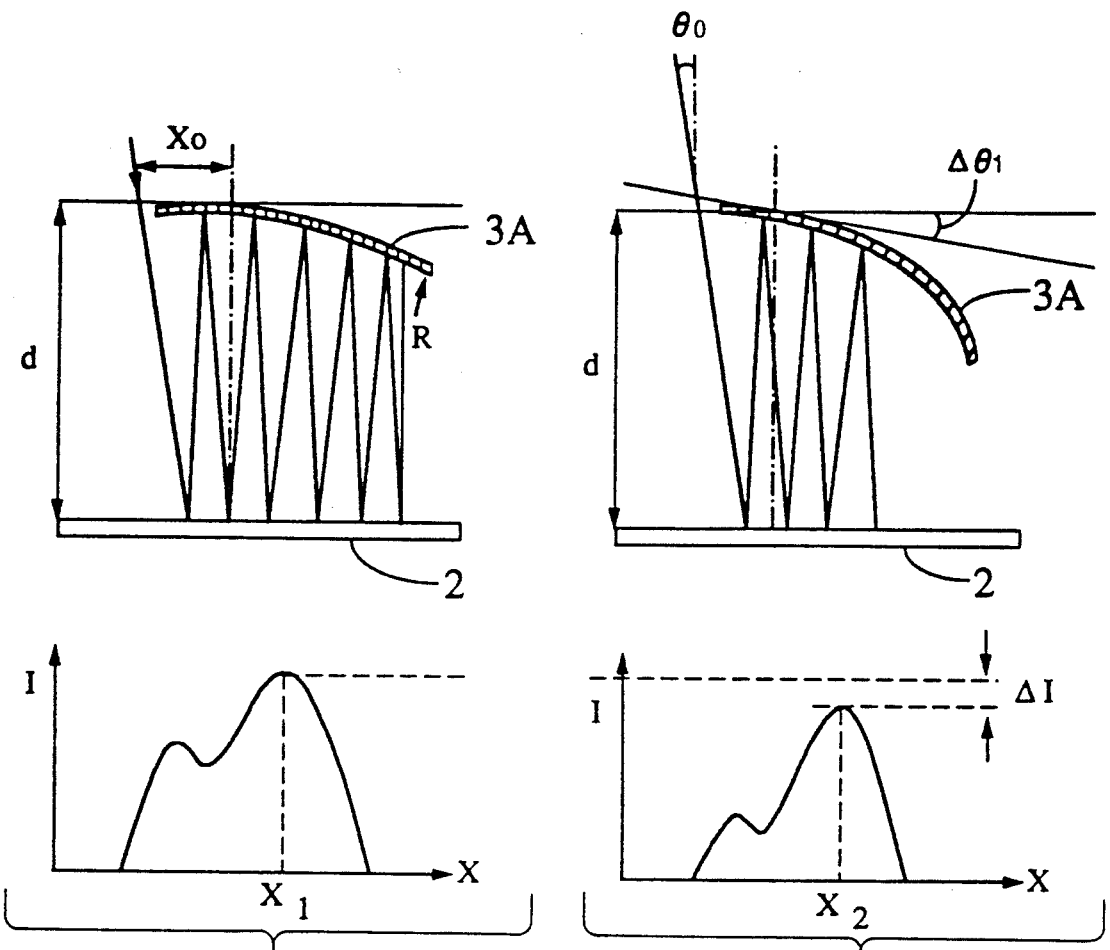
FIG. 3A and FIG. 3B depict the variation of the intensity distribution of the light.

FIG. 3A and FIG. 3B depict the variation of the intensity distribution of the light generated by the a cylindrical concave mirror 3A. The variation of the light intensity against the variation of this angle $\theta_1$ is approximately shown in the following expression.

$$\Delta I/I = -R \cdot \Delta\theta_1 (2x_o + 2\theta_o \cdot d)/\{2(x_o^2 + 2x_o \cdot \theta_o d + \theta_o^2 \cdot R \cdot d)\}$$

where,

I is the light intensity on the mask,
R is a curvature radius of cylindrical concave mirror,
$\theta_1$ is the variation of relative angle between the mask and the reflecting mirror,
$\theta_o$ is the beam incident angle against the normal line of the mask surface,
$x_o$ is the incident beam location at the cylindrical concave mirror.

By way of example, assume that $x_o = -5$ mm, $\theta_o = 12$ mrad, d=100 mm, R=15 m, $\Delta\theta_1 = 200$ μrad, then $\Delta I/I = 0.05$, which means that the light intensity variation is 5%. The spherical concave mirror 3B shown in FIG. 2B also may be used as the reflecting mirror 3 instead of the cylindrical concave mirror 3A shown in FIG. 2A.

In the preferred embodiment, the mask 2 and the work 5 move according to the movement of the machining apparatus, since the machining apparatus is not restricted to the beam irradiation area, then it is possible to machine a large sized work.

There are many embodiments of the present invention allowing for variations in the mask pattern shape, the driving method of the mask pattern, the magnifying factor of the imaging optical system of the mask pattern, the type of work and the driving method as shown by the following description.

Embodiment 2

Figure 4:
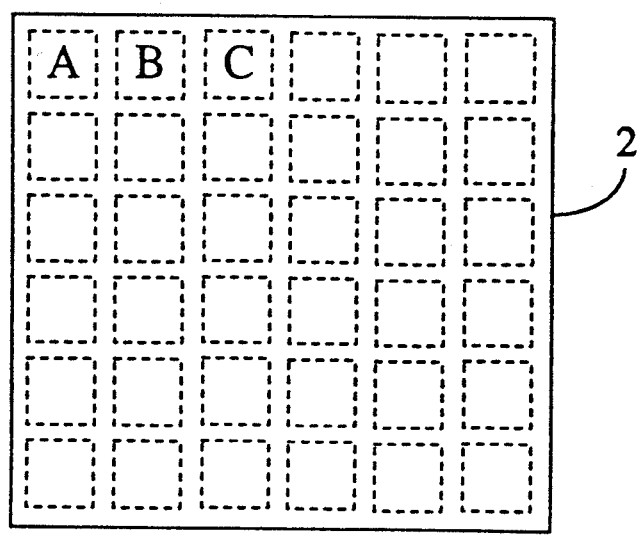
FIG. 4 illustrates one of the mask patterns of the present invention.
Figure 5:
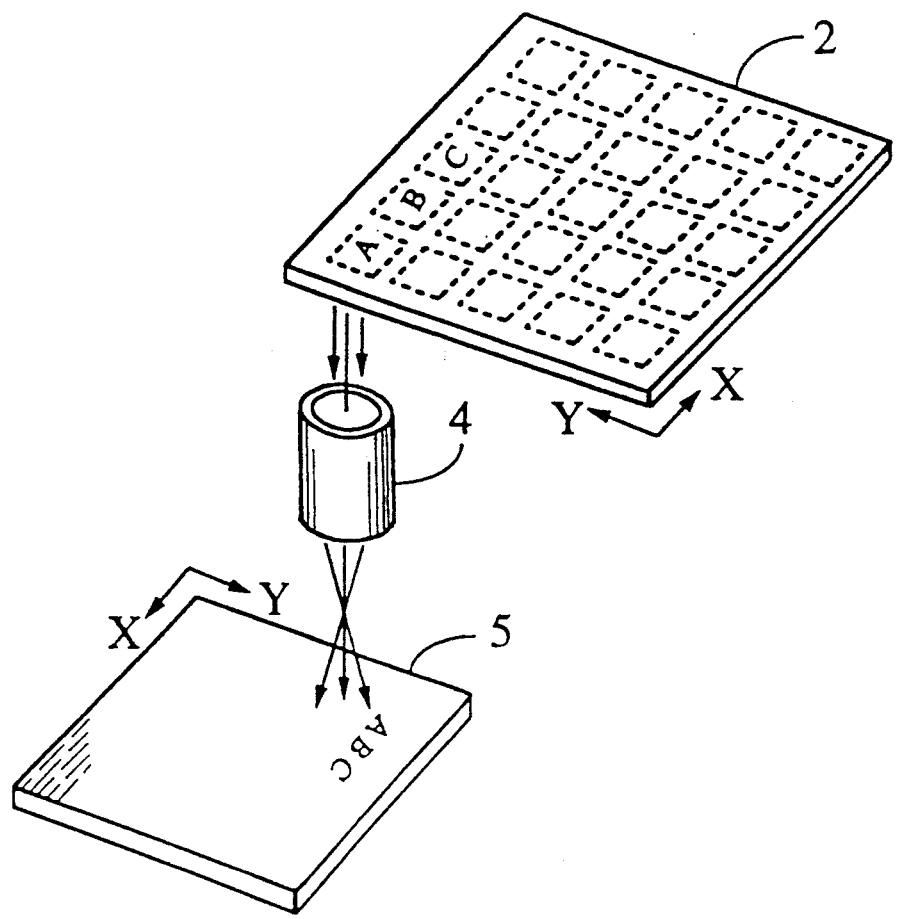
FIG. 5 shows one method for driving the mask and work of the present invention.
Figure 6:
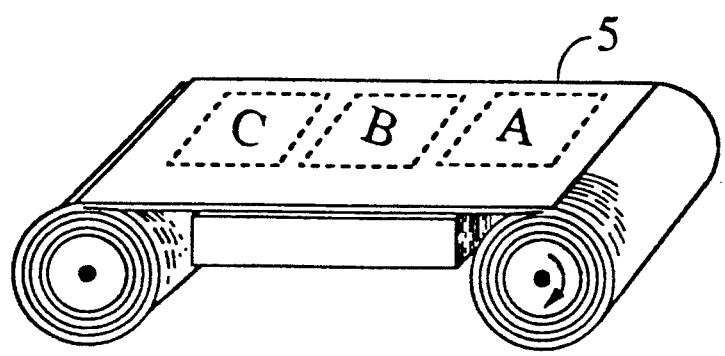
FIG. 6 illustrates another method for driving the mask and work of the present invention.
Figure 7:
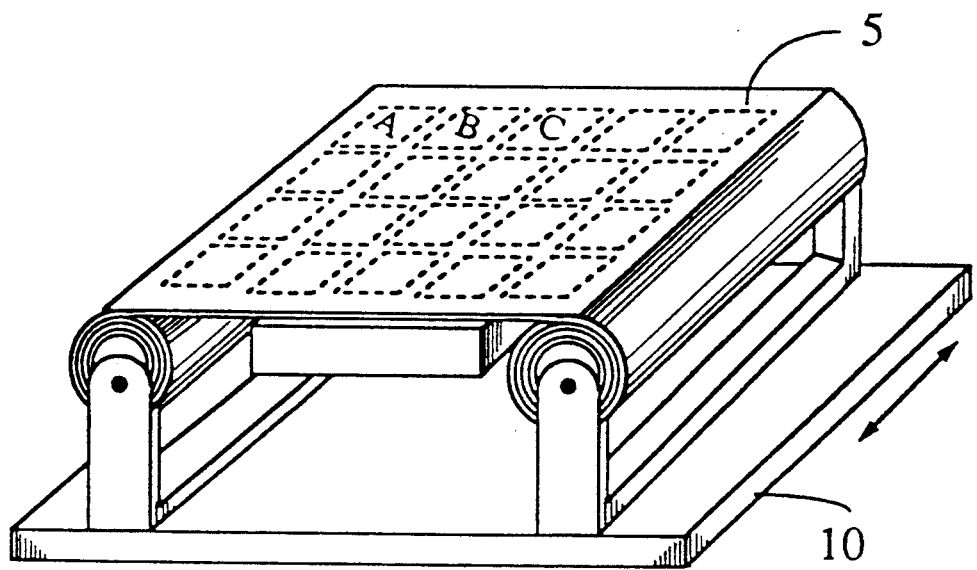
FIG. 7 illustrates another method for driving the mask and work of the present invention.

FIG. 4 is an example of a plurality of independent patterns which may be formed on the entire mask of a second embodiment of the present invention. The mask 2 is driven in a step by step method as shown in FIG. 5 in which the work is first machined at location A and the beam location is then moved to location B for irradiating and machining the work. The same process is repeated for machining entire surface of the work. The work 5 is machined by winding up and running the mask as shown in FIG. 6 or by the combination of winding of the mask and moving the mask and the stage 10 in one direction as shown in FIG. 7.

Embodiment 3

Figure 8:
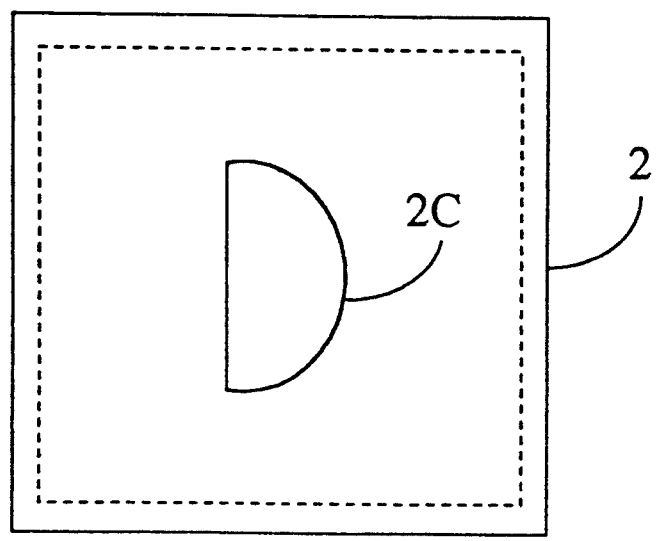
FIG. 8 is an example of a single mask pattern.
Figure 9:
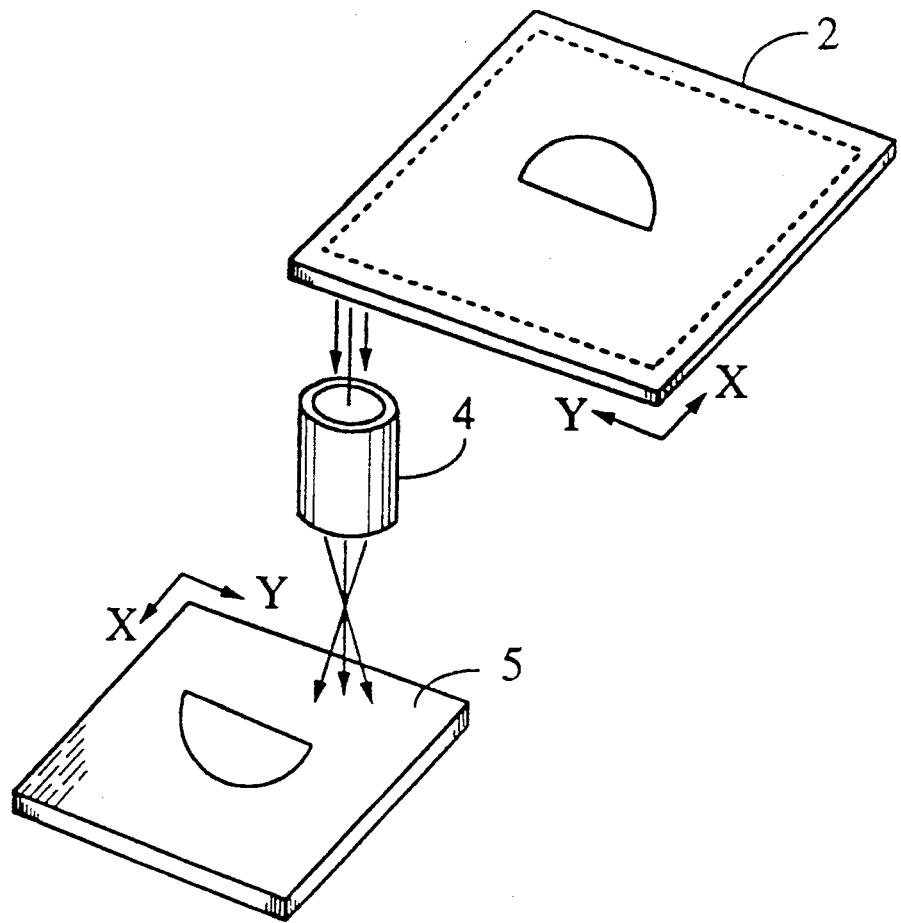
FIG. 9 illustrates another method for driving the mask and work of the present invention.

FIG. 8 is an example of single mask pattern which may be deposited over the entire mask in the third embodiment of the present invention. FIG. 9 shows another method for driving the mask and the work. The mask including the single mask pattern is driven by the step by step method shown in FIG. 9 or by the step-wise driving method in one direction as shown in FIG. 6.

Figure 10:
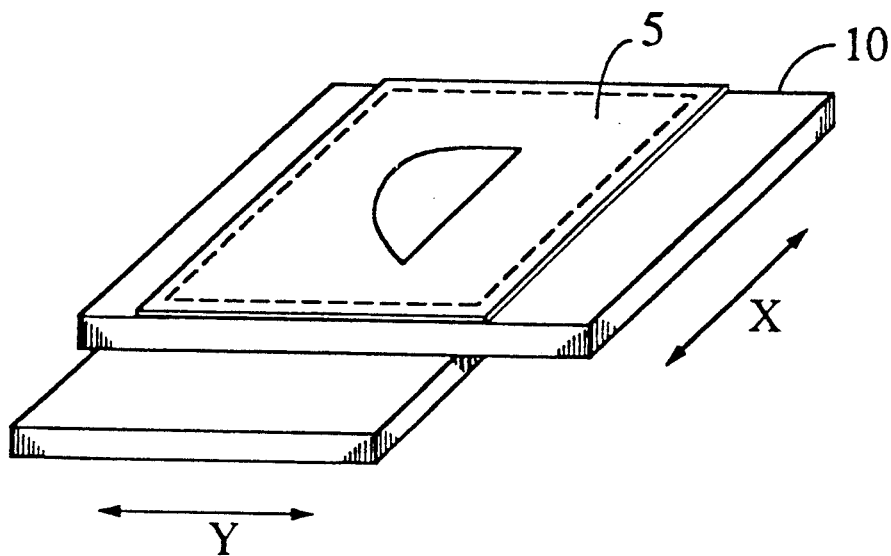
FIG. 10 illustrates another method for driving the work of the present invention.

FIG. 10 shows another driving method for driving the work which may be used with the third embodiment of the present invention. The mask is driven in the X direction using an X axis driving stage 10 and in the Y direction using a Y axis driving stage 11. Both the X and Y stages can be controlled in a step by step movement, or alternatively one stage may be controlled in a the step movement and the other stage may be in a step-wise movement.

Figure 11A:
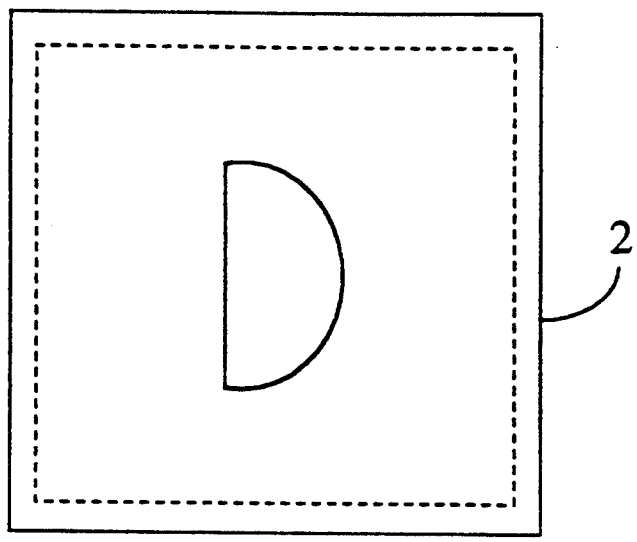
FIG. 11A is an example of a large mask pattern of the present invention.
Figure 11B:
FIG. 11B is a small area divided from the large pattern of FIG. 11A.
Figure 11B:
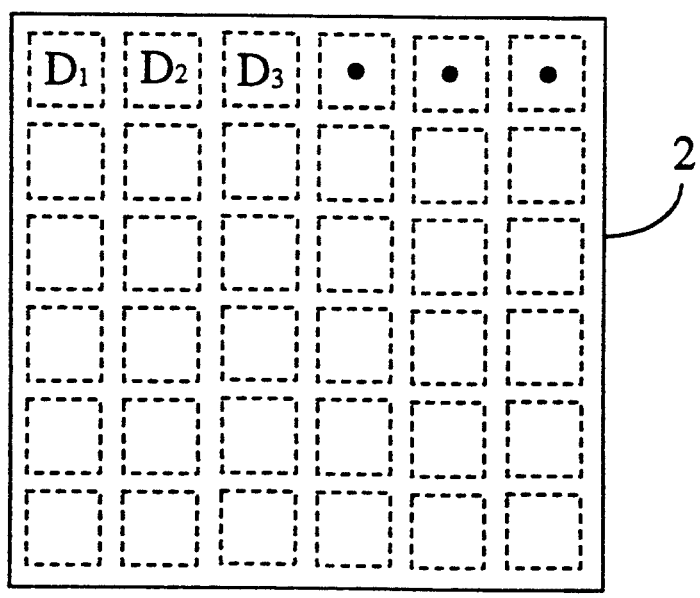

FIG. 11A is an example of another mask pattern which may be used in the present invention. FIG. 11B illustrates that the mask pattern of FIG. 11A may be accomplished by dividing the pattern into a plurality of small areas. In FIG. 11B, the small patterns corresponding the large pattern are machined by the step by step movement as described above.

In the above imaging optical system, there is no restriction regarding the magnifying factor, the elect image or the inverted image.

Embodiment 4

Figure 12:
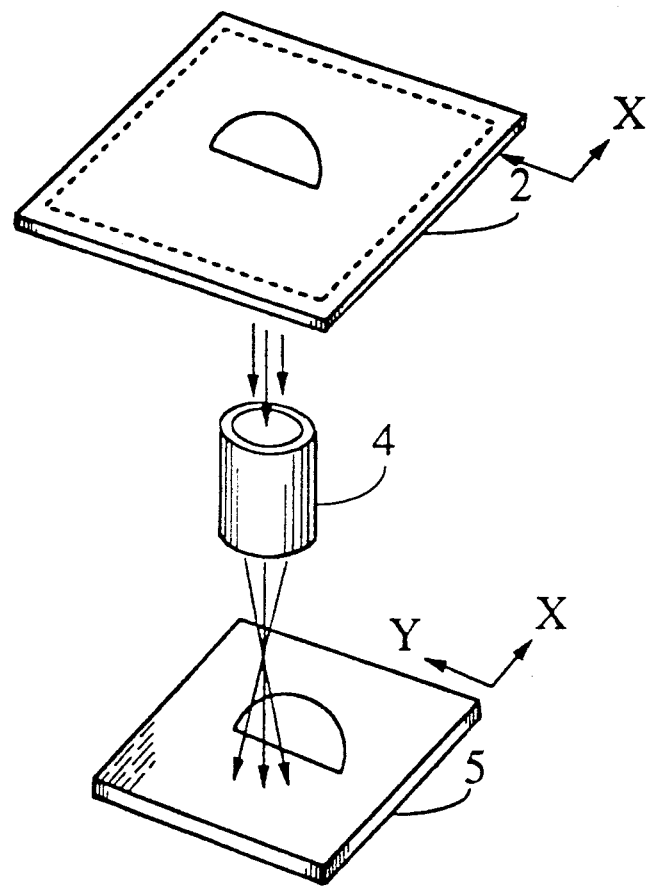
FIG. 12 illustrates a method for driving the mask and work of the present invention.
Figure 13:
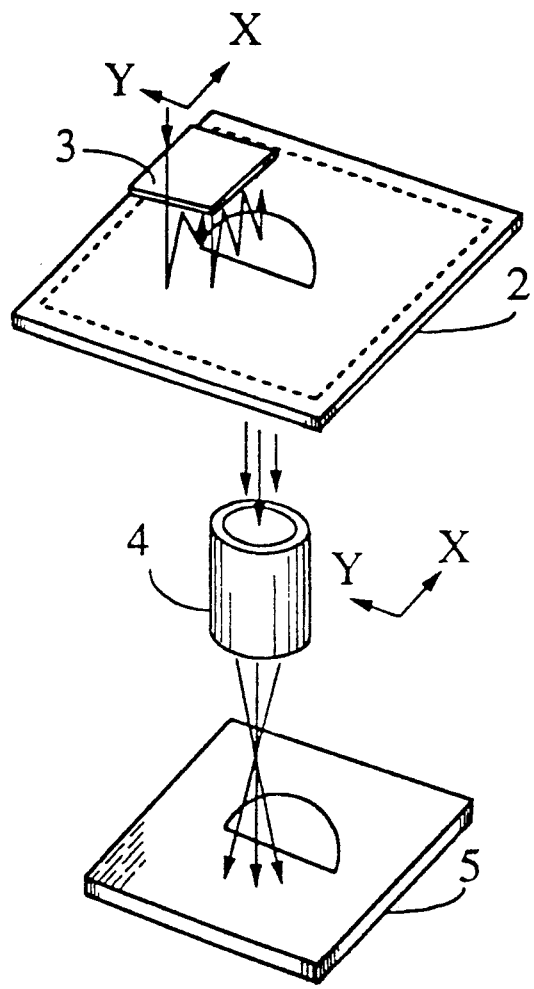
FIG. 13 illustrates a method of the present invention, for driving the beam and the lens together with the multiple reflection optical system.

FIG. 12 shows a method for driving the mask and work of a fourth embodiment of the present invention. FIG. 13 shows a method of the present invention, for driving the beam lens together with the multiple reflection optical system. In FIG. 12, the magnifying factor of the imaging optical system is correctly 1:1 and the imaging optical system is shown as an erect image. In this case, since there is no need to change the relation between the mask 2 and the work 5, it is sufficient to drive the mask 2 and the work 5 at the same time. Alternatively, the multiple reflection optical system and the beam lens may be driven together while the mask 2 and the work 5 are fixed as shown in FIG. 13.

Embodiment 5

As shown in FIG. 7, in case that the work 5 is continuously wound in roll shape, the rolled work 5 is driven with the driving stage in the X-Y direction. But, in this case the cost of the apparatus become expensive if the rolled work is large and heavy, because it is necessary to provide a large and powerful driving stage which is necessary to be controlled precisely.

Figure 14:
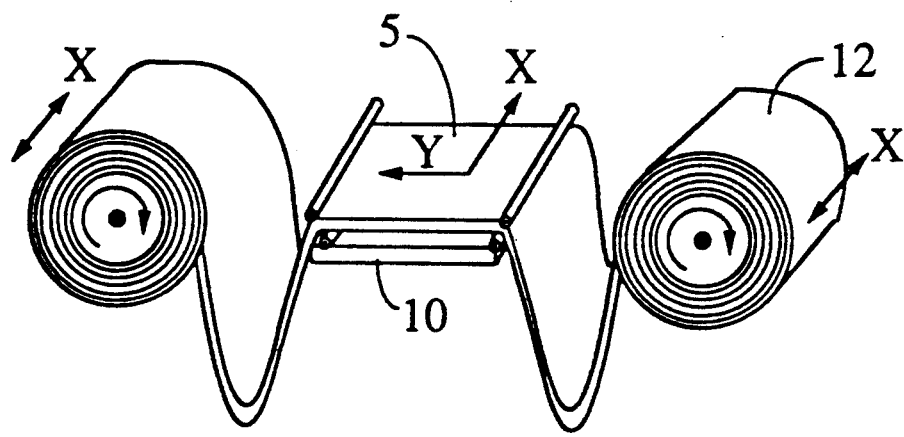
FIG. 14 illustrates another method, of the present invention, for driving the work.

FIG. 14 shows another method, of the present invention, for driving the work. This fifth embodiment comprises an X axis driving stage 10 and a Y axis driving stage (not shown in the figure), two winding rolls 12 and another driving stage which drives roughly the winding rolls 12 in the X direction (not shown in the figure). As shown in FIG. 14, the wound work 5 is placed between the X axis driving stage 10 and the winding rolls 12. In this system, since the driving stage for driving the work and the driving stage for driving the roll 12 are separated by dipping the work material between the precise stage 10 and the roll 12, the work can be driven without driving the huge and heavy roll 12. Accordingly, this type of the apparatus is inexpensive especially when the work is rolled in a large diameter.

Embodiment 6

Figure 15:
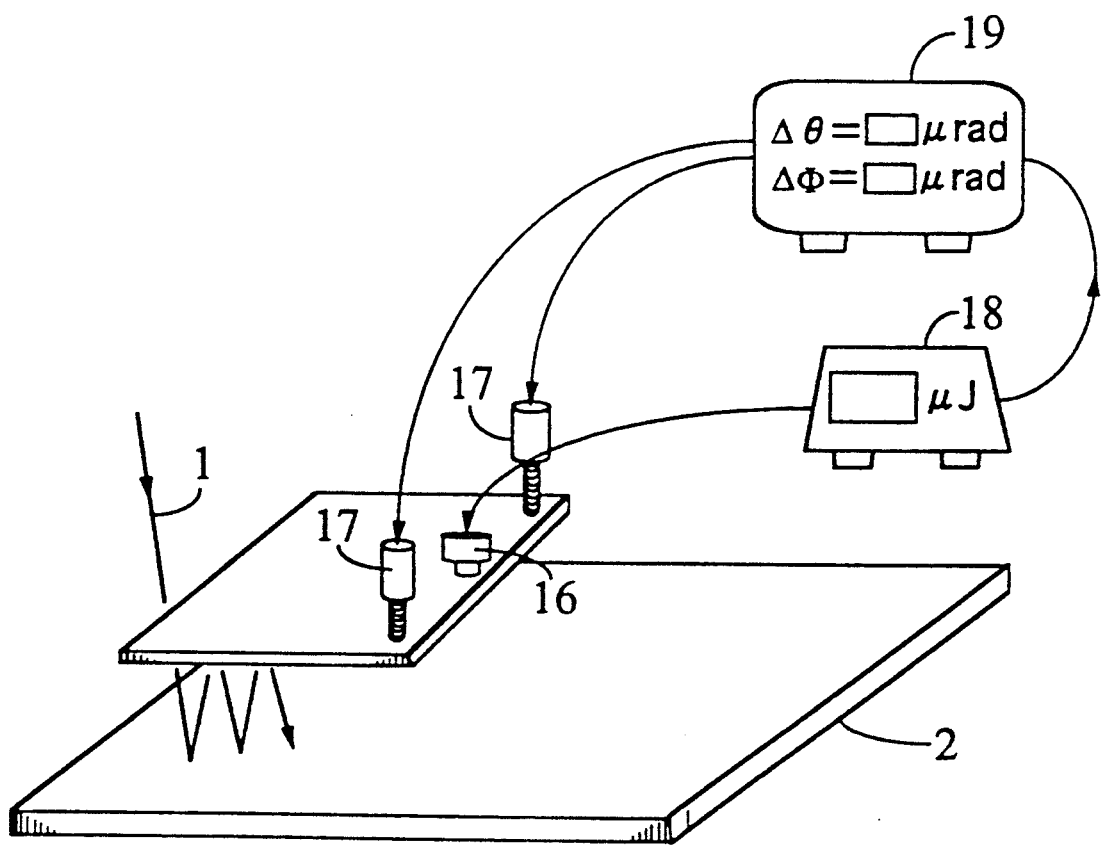
FIG. 15 is a perspective view of another embodiment of the present invention.

FIG. 15 is a perspective view of another embodiment of the present invention. This embodiment can prevent the variation of the intensity distribution of the light generated between the driving of the mask 2 and the work 5 even if the plane mirror is used as reflecting mirror 3. In FIG. 15, the numeral 16 is a power meter, the numeral 17 is a micro meter having an angle regulation drive mechanism which can be electrically driven, the numeral 18 is power a meter display, the numeral 19 is a controller which drives the micro meter 17 in response to the indication of the power meter display 18. The angle $\Delta\vartheta_1$ between the reflecting mirror and the mask usually varies when the mask 2 is driven, then the intensity distribution of the light decreases as shown in FIG. 17B. In this embodiment, the energy degradation is detected by the power meter 18. By the information from the power meter 18, the controller 19 varies the mutual angle between the mask 2 and the plane reflecting mirror 3 until the value of power meter 18 returns to the former value. The above adjusting is carried out by real time operation and the variation of the intensity distribution is thereby controlled.

In the above embodiments, the formation of the via-holes is explained. But, the present invention is not restricted to the above embodiments. The present invention may be accomplished by other kinds of machining or exposure equipments using photolithography.

Embodiment 7

Figure 18:
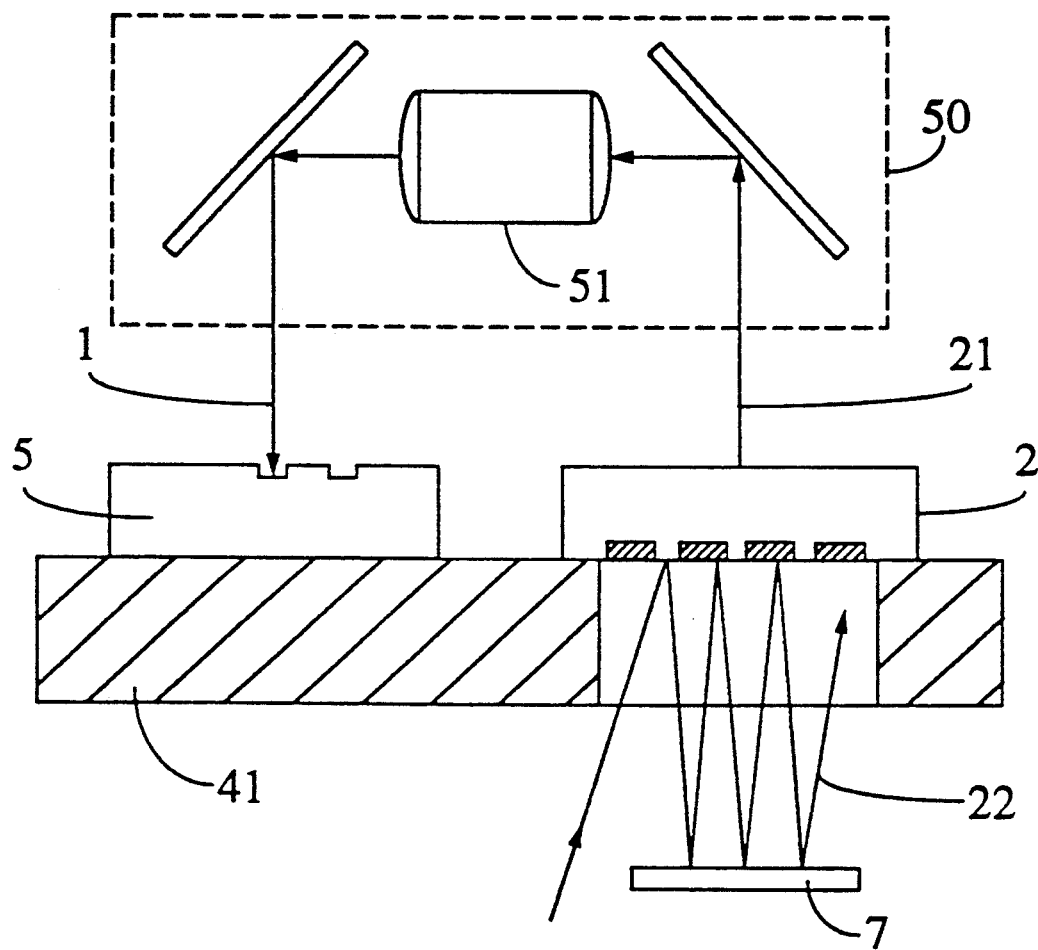
FIG. 18 is a cross sectional view of a laser machining apparatus of an embodiment of the present invention.
Figure 19:
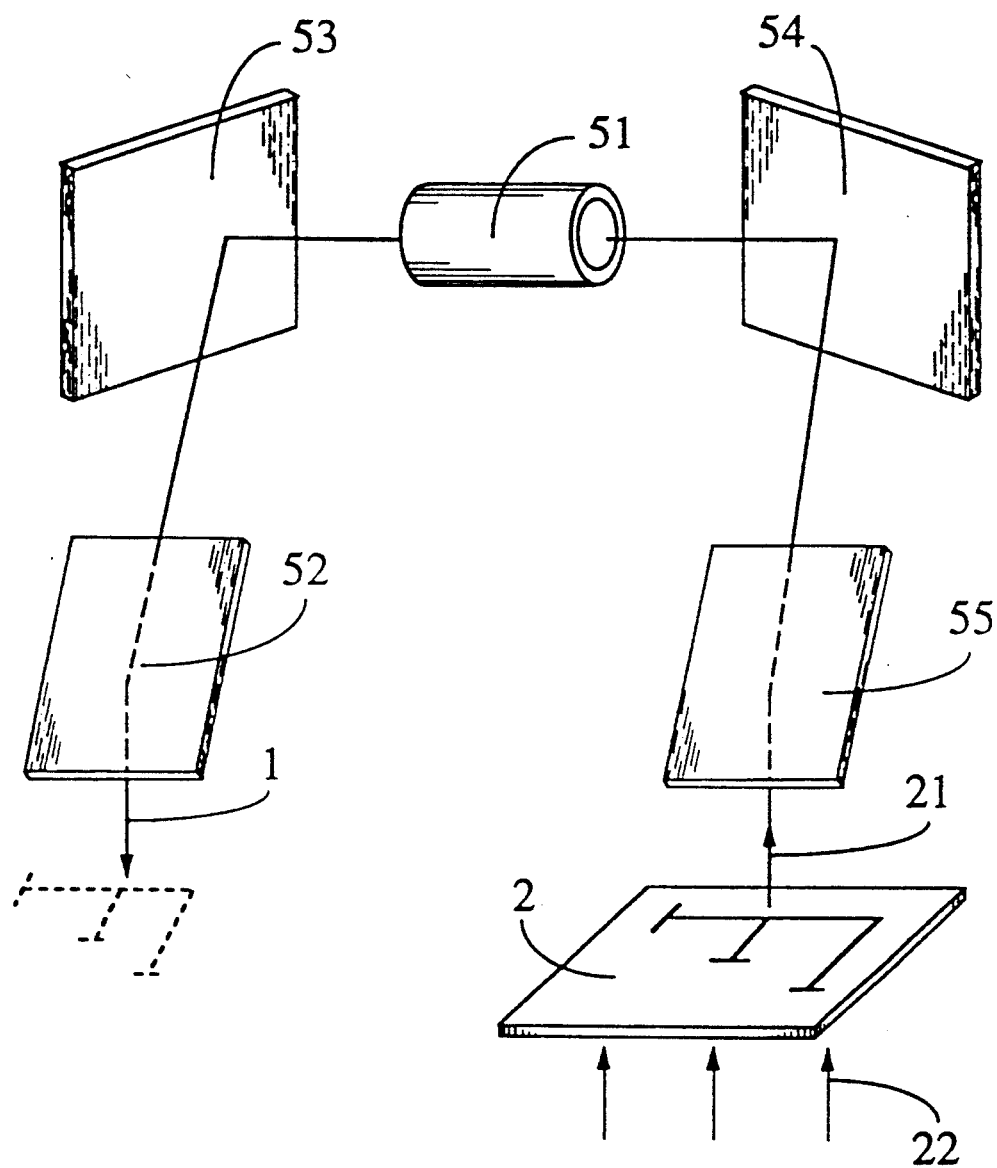
FIG. 19 is a perspective view of an example of the imaging optical system of FIG. 18.

FIG. 18 is a cross sectional view of a laser machining apparatus of an embodiment of the present invention. FIG. 19 is a perspective view of an example of the imaging optical system of FIG. 18.

In FIG. 18, the numeral 2 is a mask which passes the light only at the desired portions corresponding to the pattern to be machined, the numeral 5 is the work, the numeral 21 is a laser light which machines the work 5 through the mask 2, the numeral 22 is a laser light from the light source, the numeral 1 is a laser light which images on the work 5 via imaging lens 51 and the numeral 41 is a holding stage for putting the mask 2 and the work 5 thereon. The numeral 50 is an imaging optical system in which images the laser light on the work 5 through the mask 2 and copies the mask pattern on the work 5. The numeral 7 is a mirror which reflects the laser light 22. In this case, the projection magnifying factor of this optical system is 1. The imaging optical system 50 has the projection magnifying factor of ($-1$) and comprises, for example, the imaging lens 51 which image the inverted image and the reflecting mirrors 52, 53, 54, 55.

The operation of the seventh embodiment is explained here. The laser light 22 is irradiated on the mask 2. The laser light 21 passes through the transmission portion of the mask. The laser light 21 is imaged on the work 5 and the mask pattern is projected on the work 5 so that the machining is carried out. In the imaging optical system 50, the erect image having the magnifying factor of 1 is copied on the work 5. Since the area where the light may be irradiated at mask 2 is limited, the holding stage 41 is arranged for driving the work 5 synchronously while scanning the whole surface of the mask 2.

In this embodiment, the mask 2 and the work 5 are driven simultaneously at the same speed. Since the magnifying factor of imaging optical system 50 is 1, the driving speed of the mask 2 and the work 5 is the same and the pattern on the mask 2 is imaged precisely on the work 5. In the embodiment, the mask 2 and the work 5 are driven on the same holding stage 41 and therefore are driven at the same time. Therefore, in theory there is no asynchronous deviation between the mask 2 and the work 5. Accordingly, highly accurate machining can be carried out.

Embodiment 8

Figure 20:
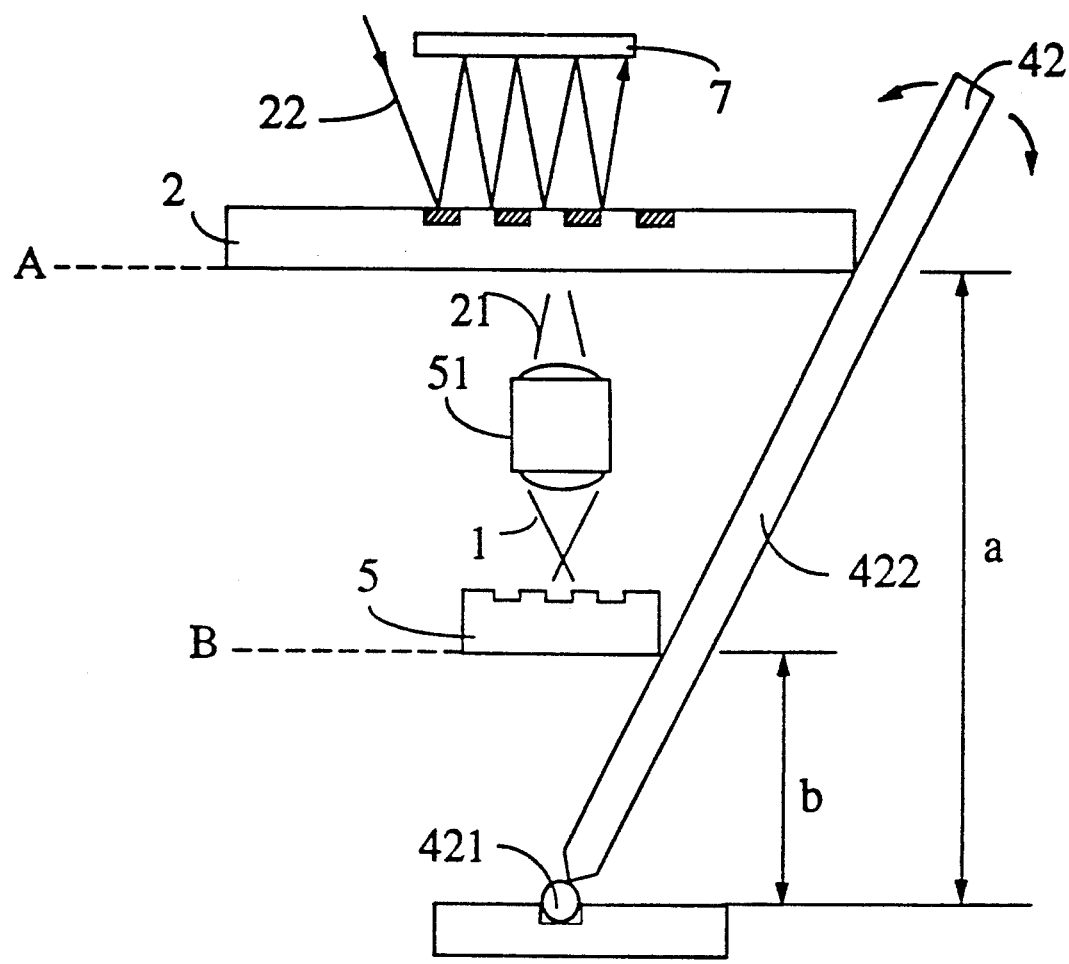
FIG. 20 is a cross sectional view of a laser machining apparatus of another embodiment of the present invention.

FIG. 20 is a cross sectional view of a laser machining apparatus of an eighth embodiment of the present invention. In FIG. 20, the mask 2 and the work 5 are put on the separate stages (not shown) so that they can be driven in the predetermined planes (plane A and plane B), respectively. The mask 2 and the work 5 are coupled with the slip plane 422 of the coupling bar 42, one end of which rotates around the fulcrum 421 in the indicated arrow directions. In this case, an erect imaging lens having magnifying factor $M>0$ is used as the imaging lens 51 in the imaging optical system 50. Assume that the distance from the fulcrum 421 to the plane A is a and the distance from the fulcrum 421 to the plane B is b, then the magnifying factor M is given as $M=b/a$. If the distance a and b are moved according to the magnifying factor M of imaging lens 51, the mask 2 and the work 5 are driven at the desired speed ratio, and there is no asynchronous deviation between them in theory. In this case, either of the mask 2 or the work 5 may be driven in order to drive the other one.

Embodiment 9

Figure 21:
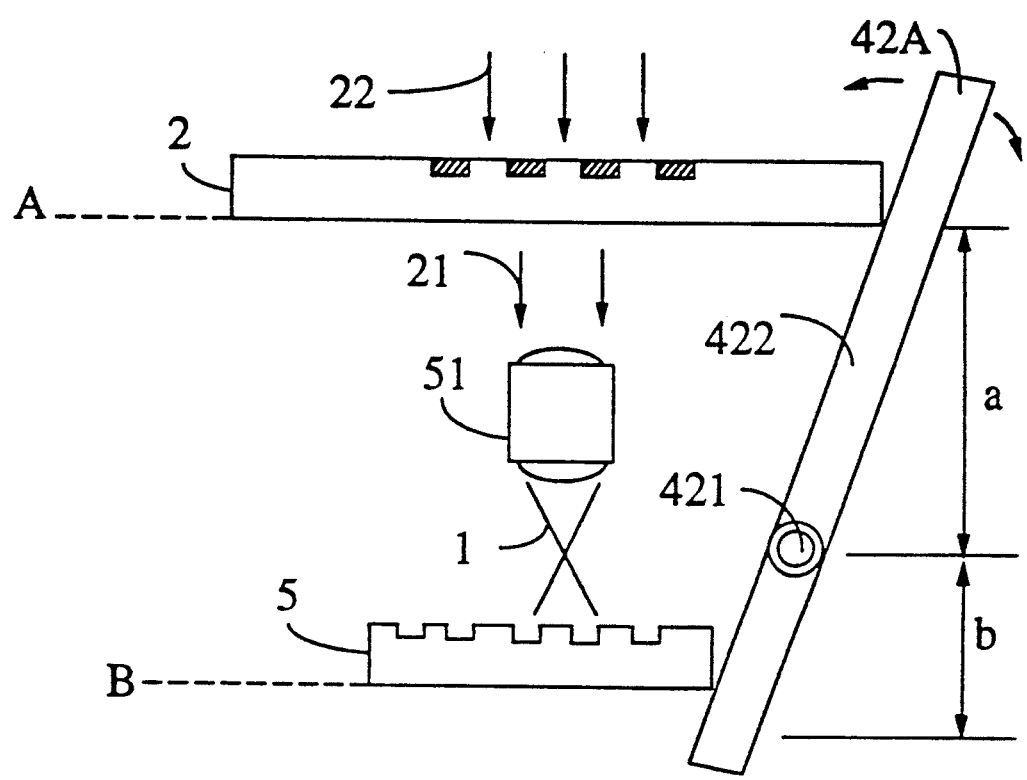
FIG. 21 is a cross sectional view of a laser machining apparatus of another embodiment of the present invention.

FIG. 21 is a cross sectional view of a laser machining apparatus of a ninth embodiment of the present invention. In FIG. 21, the mask 2 and work 5 are put on the separate stage (not shown) so that they can be driven on the predetermined planes (plane A and plane B), respectively. The mask 2 and the work 5 are coupled to the slip plane 422 of the coupling bar 42A, both ends of which rotate around the fulcrum 421 toward the arrow directions.

In this case, since the mask 2 and the work 5 are driven in a reverse direction to each other, an inverted image optical lens having magnifying factor $M<0$ is used as the imaging lens 51 in the imaging optical system 50. In the other aspects the construction of laser machining apparatus of FIG. 21 is the same as that of FIG. 20.

Embodiment 10

Figure 22A:
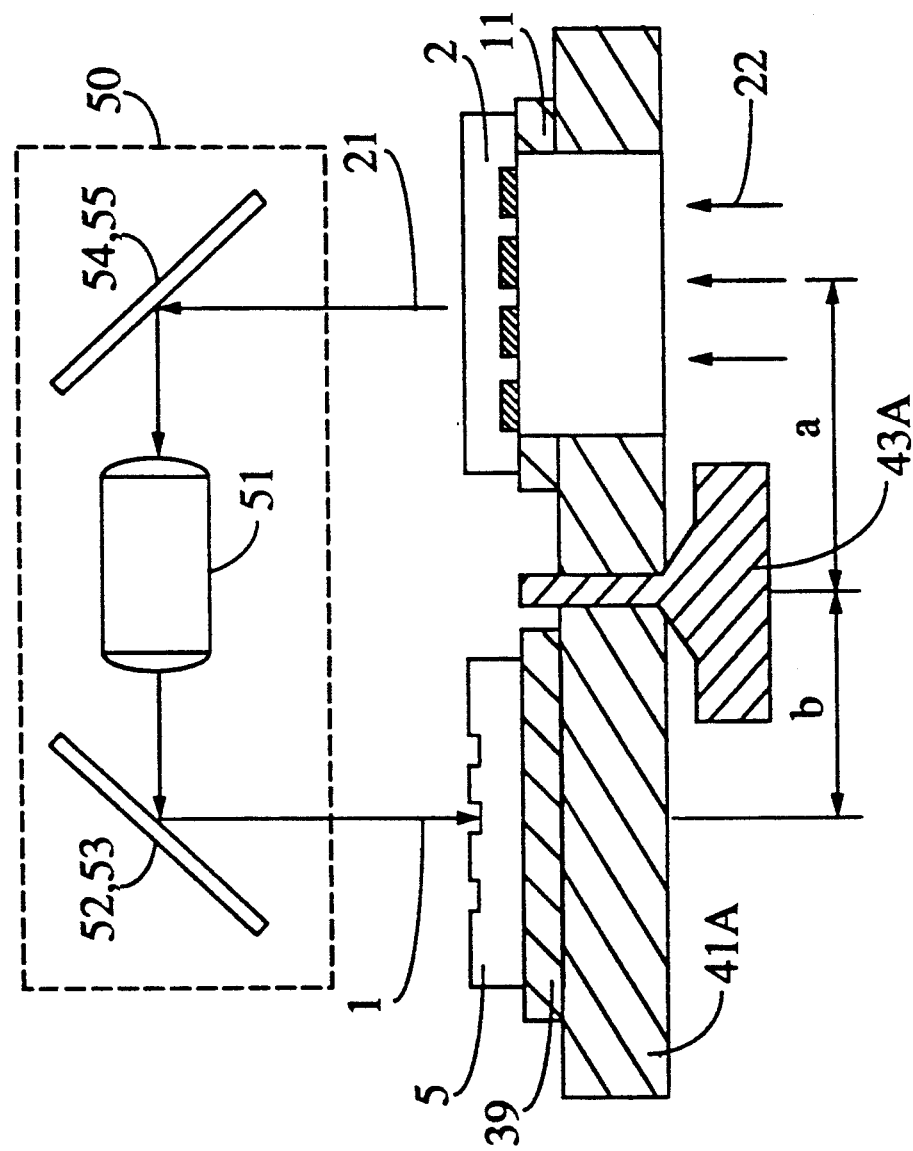
FIG. 22A and FIG. 22B are a cross sectional view and a plan view of a laser machining apparatus of another embodiment of the present invention.
Figure 22B:
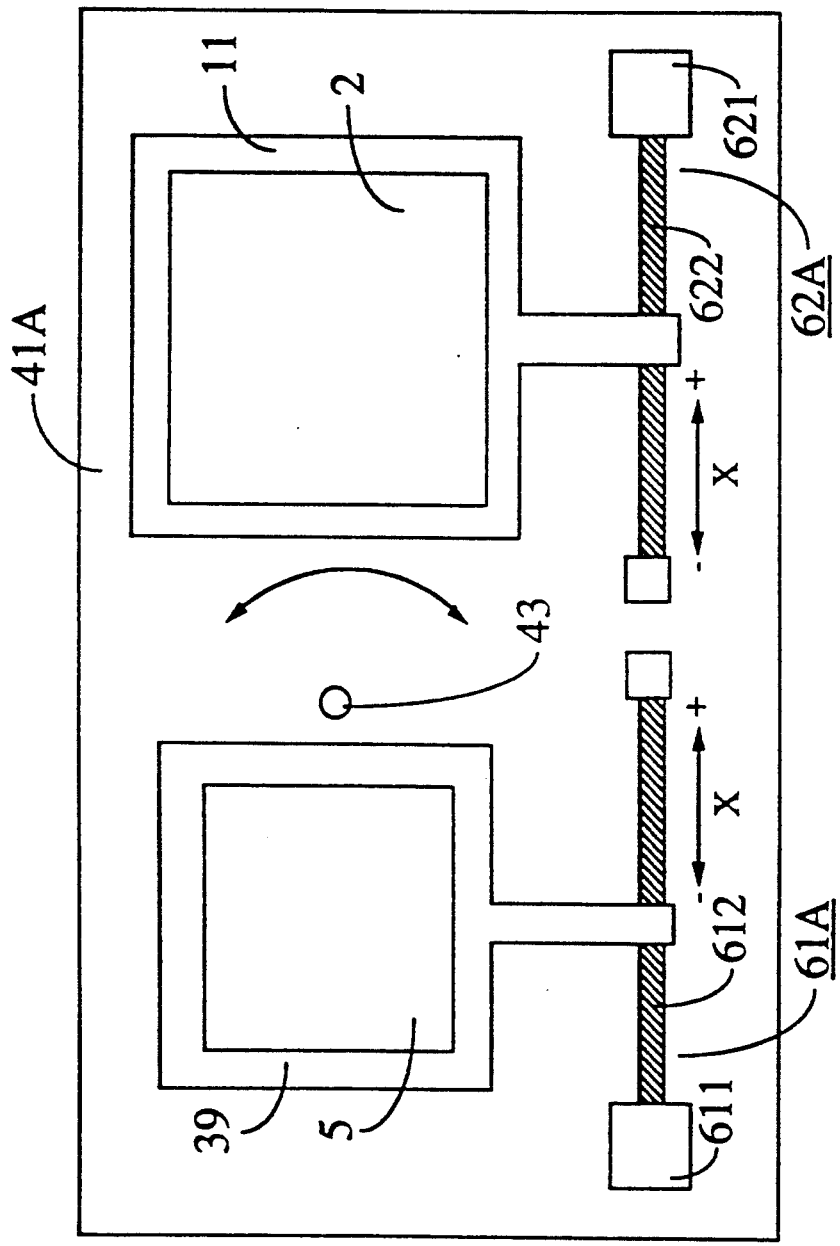

FIG. 22A and FIG. 22B are a cross sectional view and a plan view of a laser machining apparatus of a tenth embodiment of the present invention. In FIG. 22A and FIG. 22B, the mask 2 and the work 5 are arranged on the mask platform 11 and the work platform 39, respectively, which are placed on the turn stage 41A. The turn stage 41A is supported by the drive 43A which turns around the rotation axis 43. The work platform 39 is driven by the drive mechanism 61A which comprises the motor 611 and the ball screw 612 on the turn stage 41A. The motor 611 causes the ball screw 612 to rotate, thereby the work platform 39 is driven. The mask platform 11 is driven by the drive mechanism 62A which comprises the motor 621 and the ball screw 622 on the turn stage 41A. The motor 621 causes the ball screw 622 to rotate, thereby the mask platform 11 is driven.

More specifically, the work platform 39 is coupled to the ball screw 612 and driven in the X direction by the rotation of the ball screw 612 as shown in FIG. 22B. In the same way, the mask substrate platform 11 is coupled to the ball screw 622 and driven in the X direction by the rotation of the ball screw 622 as shown in FIG. 22B. The work platform 39 and the mask platform 11 are driven so that the pattern of the mask 2 are imaged precisely on the work 5 through the imaging optical system 50. The imaging optical system 50 is an inverted optical system as shown in FIG. 19, and the magnifying factor is M. Accordingly, the work platform 39 and the mask platform 11 are driven in the reverse direction relative to one other. Assume that the driving velocity of the work platform 39 is Vs and the driving velocity of the mask platform 11 is Vm, then the relation between them are represented as $Vs = -MVm$.

In this embodiment, the mask 2 and the work 5 are put on the platforms on the same turn stage 41A, each of which is driven independently in the X direction by drive mechanism 61A and drive mechanism 62A, respectively. The turn stage 41A turns around the rotation axis 43 in the direction indicated by the arrow. The rotation axis 43 is arranged on the straight line between the mask 2 and the work 5. The imaging lens 51 of the imaging optical system 50 is an erect imaging lens having magnifying factor $M>0$.

Figure 23A:
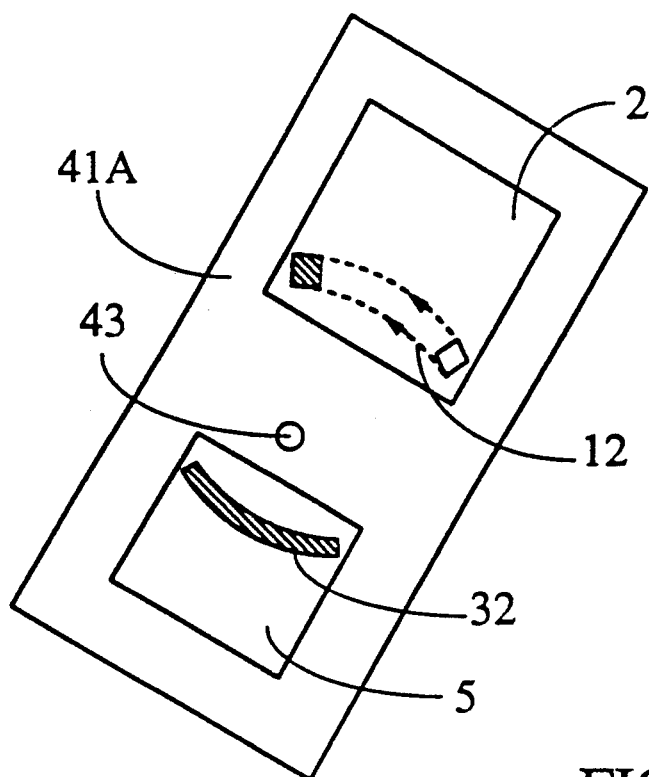
FIG. 23A and FIG. 23B explain the operation of the construction of FIG. 22.
Figure 23B:
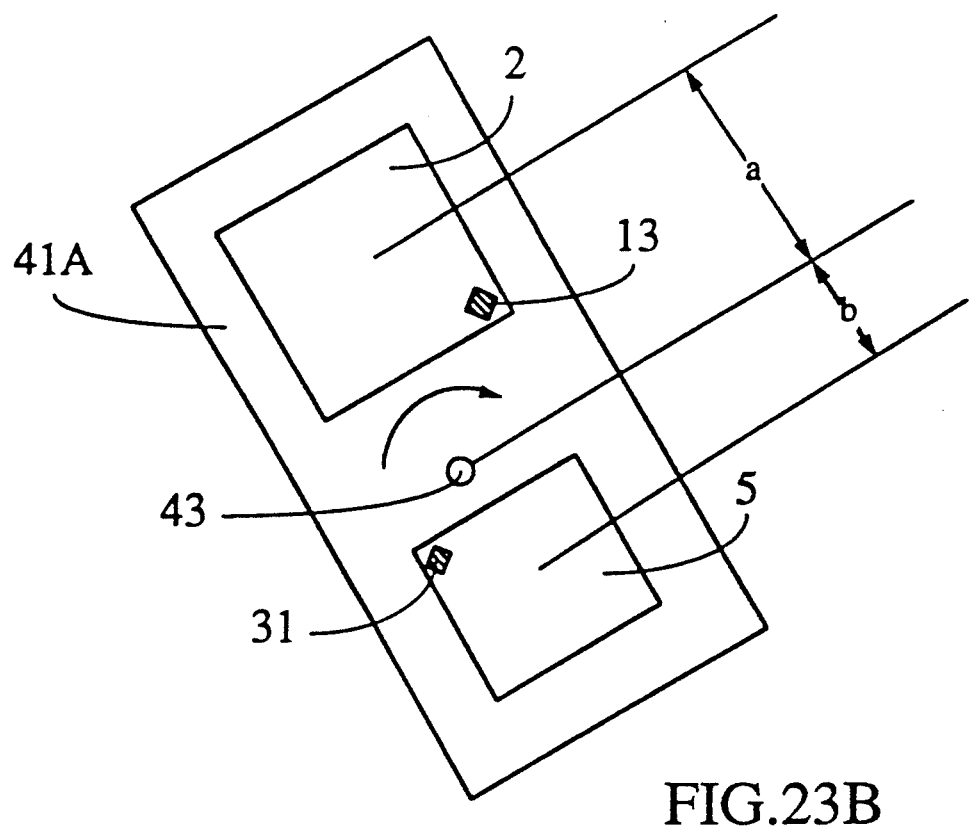

FIG. 23A and FIG. 23B explain the operation of the construction of FIG. 22A and FIG. 22B. In FIG. 23B, the relation between the light irradiation area 13 on the mask 2 and the light irradiation area 31 on the work 5 are represented as M=b/a, where the distance between the center of the mask 2 and the center of the rotating center of the rotation axis 43 is a, and the distance between the center of the work 5 and the center of the rotating center of the rotation axis 43 is b.

The operation of the tenth embodiment of the present invention is explained here. In FIG. 23A and FIG. 23B, the laser light (shown in FIG. 22A) is irradiated vertically from under surface of the mask 2. In FIG. 23B, the mask 2 is now irradiated at the area 13 shown in the slanted line. The laser light passed through the imaging optical system 50 (shown in FIG. 22A) images on the area 31 in order to machine the corresponding portion on the work 5. The machining area on the work 5 is an area 31 shown by the slanted line. When the turn stage 41 turns around the axis 43, and the laser light irradiates the fan-shaped area 12 on the mask 2, accordingly the corresponding fan-shaped area 32 on the work 5 is machined as shown in FIG. 23A.

Figure 24A:
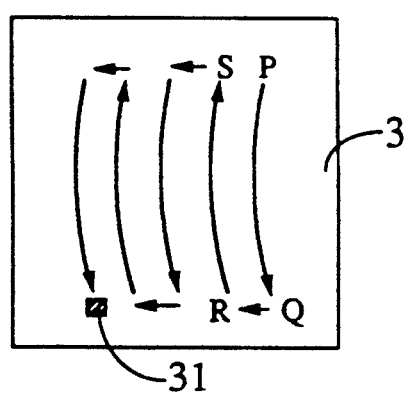
FIG. 24A and FIG. 24B explain the operation of the construction of FIG. 22.
Figure 24B:
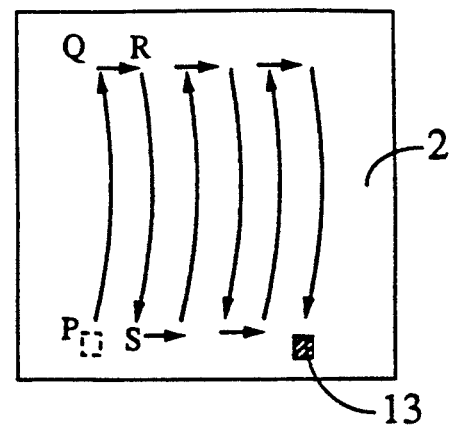

FIG. 24A and FIG. 24B explain the operation of the construction of FIG. 22A and FIG. 22B in more detail. The mask 2 and the work 5 are driven, respectively, at the speed ratio of the magnifying factor M in order to machine the fan-shaped area. The order for irradiating the mask 2 and for machining the work 5 is shown in the sequence of P, Q, R, S as shown in FIG. 24B and FIG. 24A, respectively.

According to the above method, since the mask 2 and the work 5 are put on the same turn stage 41A, it is possible in theory to machine the work in synchronization with the mask 2.

Regarding the stage synchronization, usually it is easy to align the position of the mask 2 and the work 5, but it is difficult to maintain the accuracy of the speed control when the mask 2 and the work 5 are both continuously driven. In this embodiment, the continuous speed control is carried out by rotating the turn stage, and the step control is carried out by driving separate driving systems for the mask 2 and the work 5, respectively. Accordingly, the apparatus of the present invention can maintain the high accuracy of the step-wise driving and also can respond to the driving at a desired speed rate.

Embodiment 11

Figure 25:
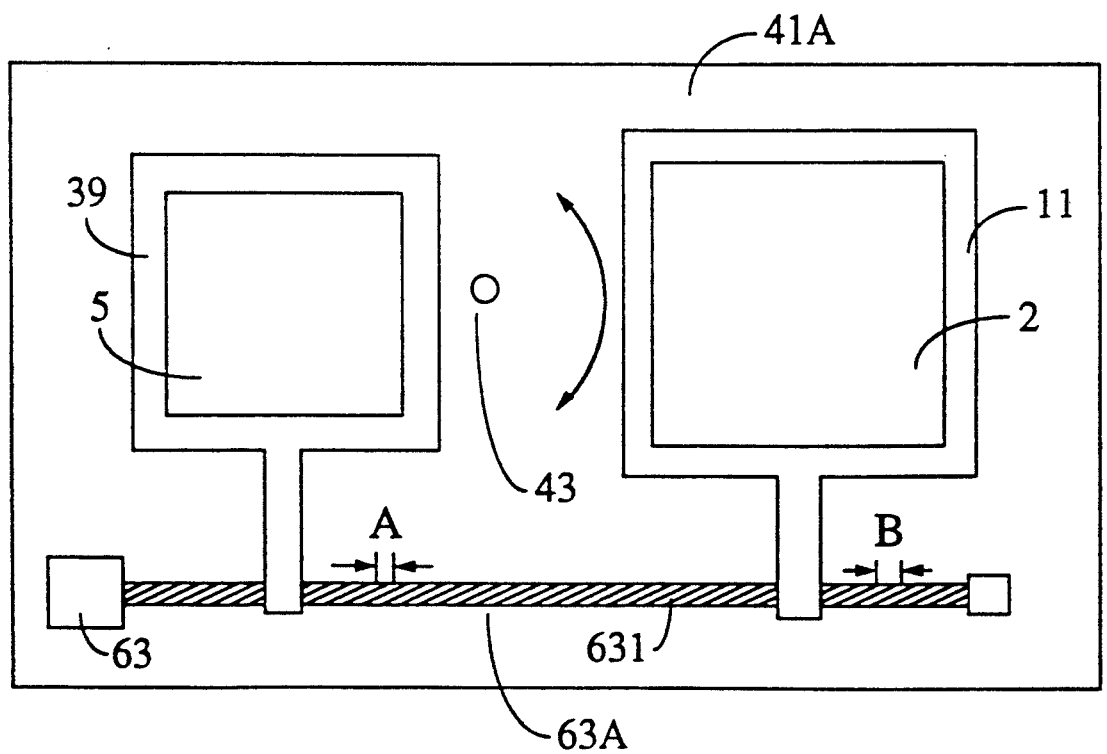
FIG. 25 is a plan view of a laser machining apparatus of another embodiment of the present invention.

FIG. 25 is a plan view of a laser machining apparatus of an eleventh embodiment of the present invention. In the previous embodiment, the mask 2 and the work 5 are driven by separate drives 61A, 62A. But, in this embodiment, they are driven by one drive mechanism 63A. In FIG. 25, the mask 2 is driven by the ball screw having pitch A and the work 5 is driven by the ball screw having pitch B. The two ball screws having different pitch are connected to one ball screw 631 and driven by the motor 63. In this construction, since the mask 2 and the work 5 are always driven together, there is no asynchronous deviation during the synchronous operation.

Embodiment 12

Figure 26:
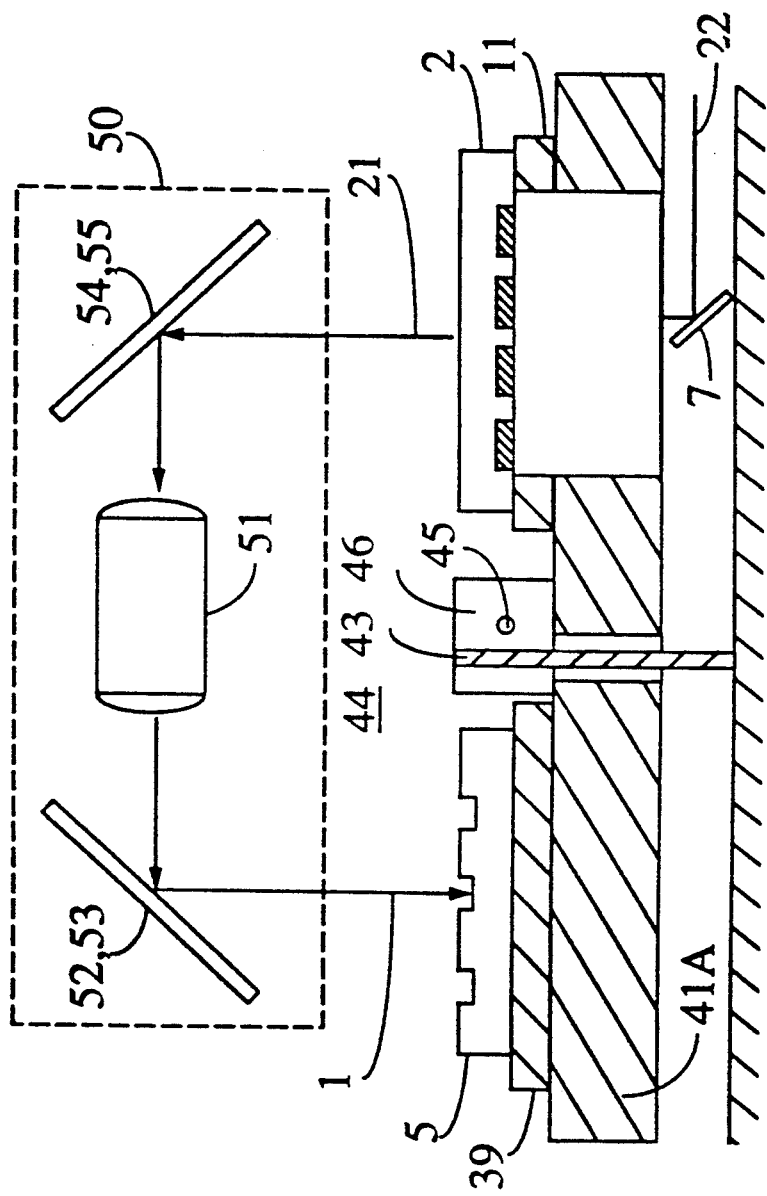
FIG. 26 is a cross sectional view of a laser machining apparatus of another embodiment of the present invention.
Figure 27:
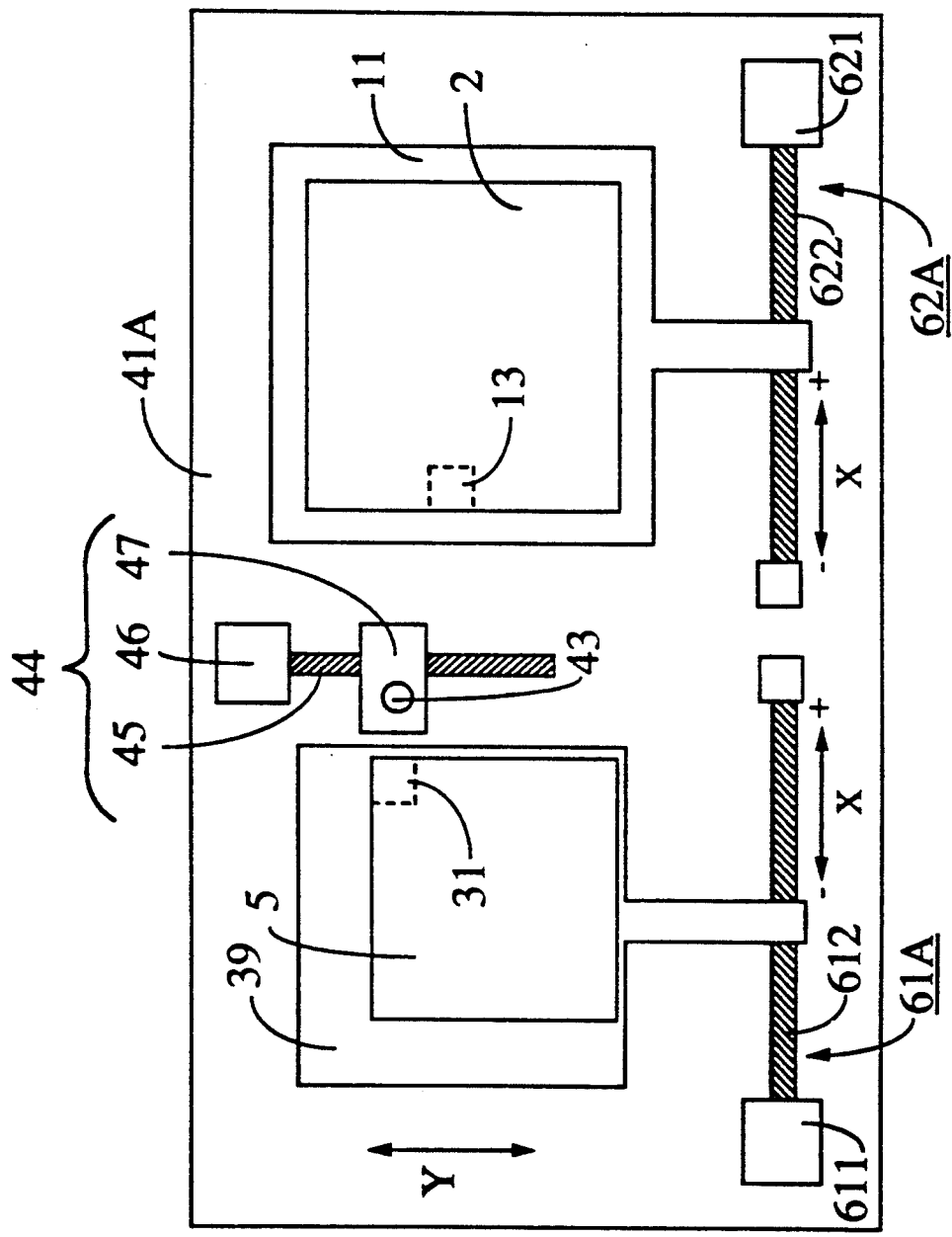
FIG. 27 explains the operation of the construction of FIG. 26.
Figure 28:
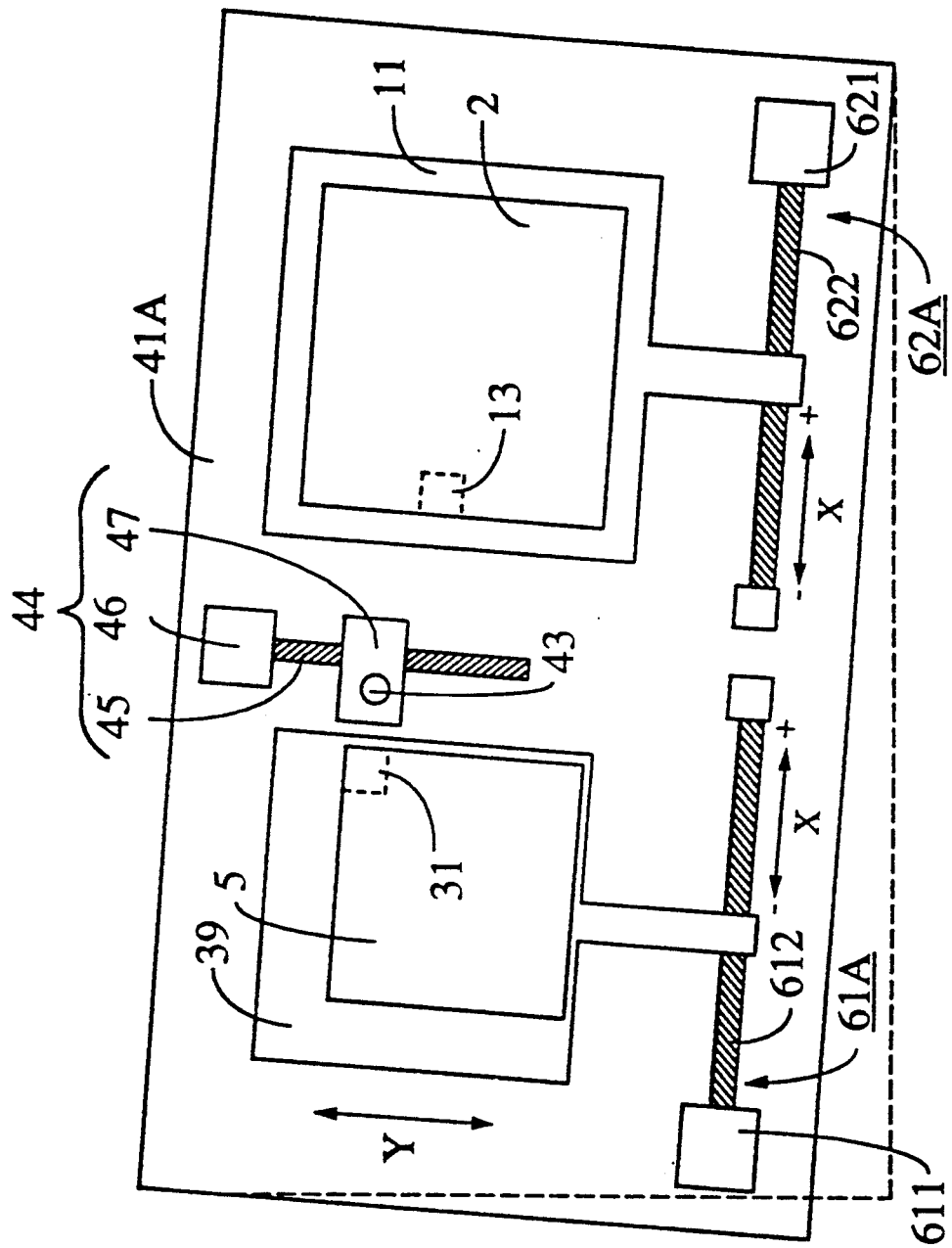
FIG. 28 explains the operation of the construction of FIG. 26.

FIGS. 26~28 illustrate a twelfth embodiment of the present invention. FIG. 26 is a cross sectional view of a laser machining apparatus which shows a construction of the twelfth embodiment of the present invention.

FIG. 27 explains the operation of the construction of FIG. 26. FIG. 28 also explains the operation of the construction of FIG. 26.

In the mass production machining apparatus, it is usually necessary to use a positioning drive mechanism 44 for positioning the work 5. The twelfth embodiment comprises a positioning drive mechanism 44 in addition to the eleventh embodiment of FIG. 22A and FIG. 22B. In FIG. 26, the work 5 is put on the stage 39 which is driven in the one direction on the holding stage 41A. Therefore, if the work 5 is not placed on the stage 39 at the correct location, the corresponding portion of the work 5 is not machined accurately. For example, even if the center of the mask 2 (area 13) is irradiated, the end portion of the work 5 (area 31) is machined. This machining deviation originates from the non-alignment of each center of the mask 2, the work 5 and the rotation axis 43.

In the twelfth embodiment, the drive mechanism 44 is arranged such that the holding stage 41A is driven in the Y axis direction against the rotation axis 43. The drive mechanism 44 comprises a motor 46 which has a ball screw 45 which is fixed above the stage 41A and a joint 47 which is connected to the ball screw 45 by screw connection. In this construction, if the machining area is deviated as shown in FIG. 27, the holding stage 41A can be driven by driving the drive mechanism 44 against the rotation axis 43 as shown in FIG. 28.

By the above operation, the rotating center 43 of the holding stage 41, the center of the mask 2 and the center of the work 5 are aligned on a straight line, then the machining deviation can be adjusted upward and downward as shown in the figure. The right and left direction adjustment of the mask 2 and the work 5 can be carried out by adjusting drive mechanism 62A and 61A which are connected with the mask 2 and the work 5, respectively.

Embodiment 13

Figure 29:
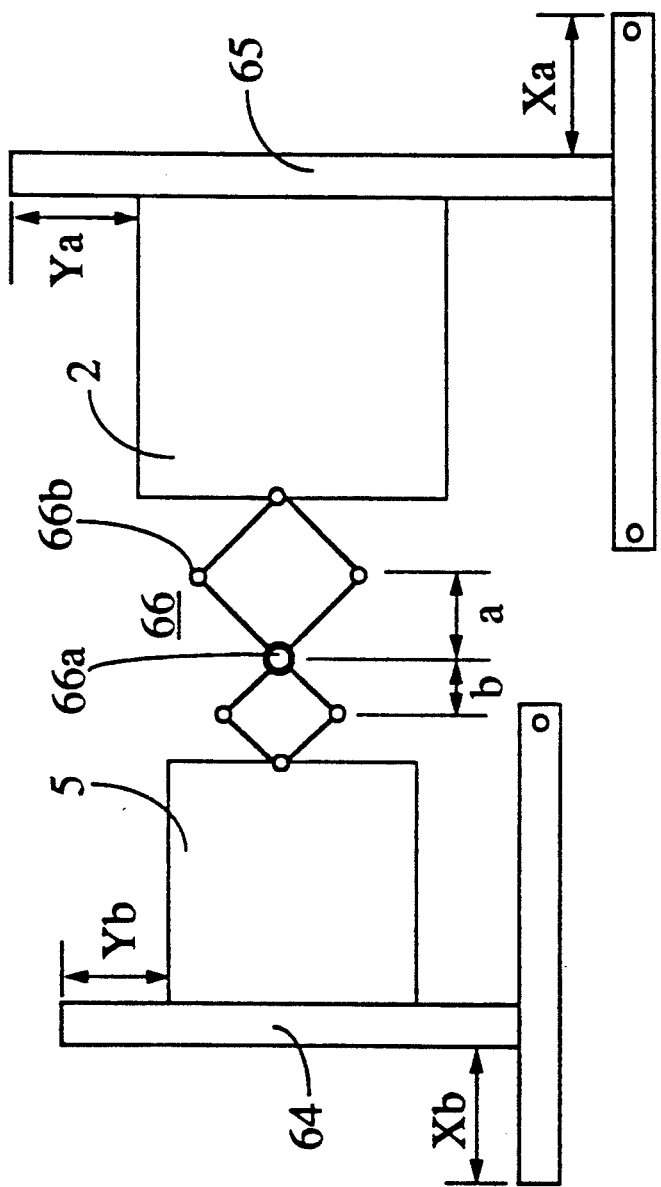
FIG. 29 is a plan view of a laser machining apparatus of another embodiment of the present invention.
Figure 30:
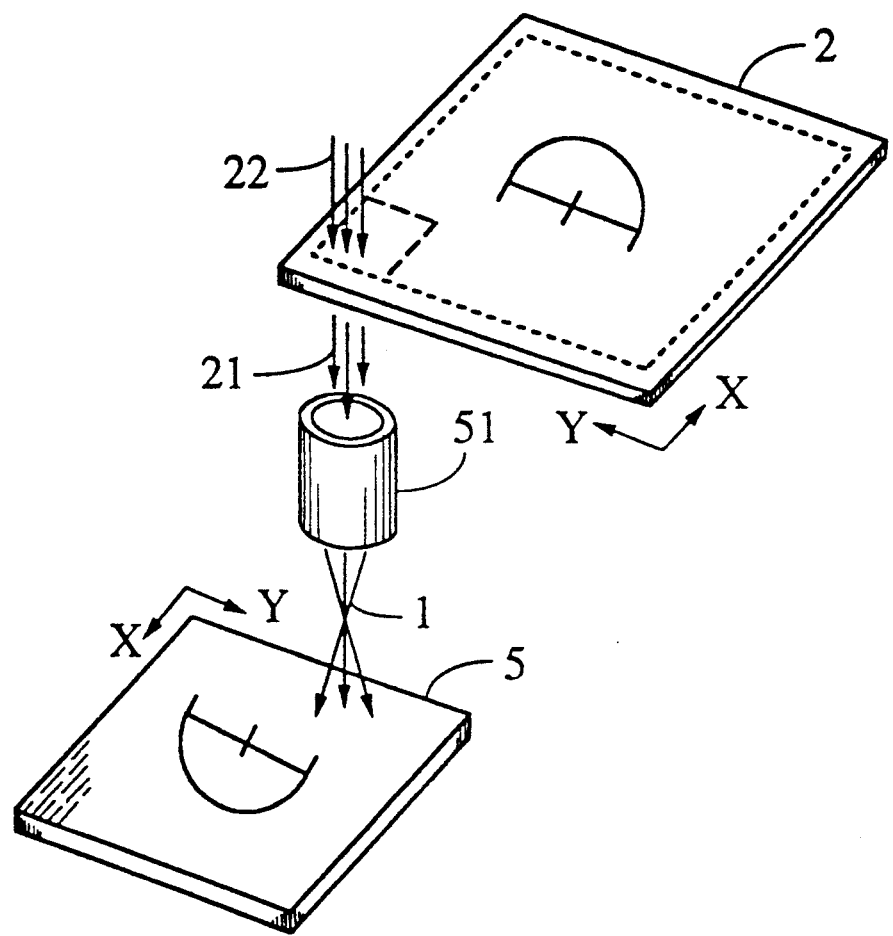
FIG. 30 is the perspective view of a construction of a conventional laser machining apparatus.

FIG. 29 is a plan view of a laser machining apparatus of a thirteenth embodiment of the present invention.

The thirteenth embodiment comprises stages 64 and 65 which drive the mask 2 and the work 5, respectively, each of which is driven in the X direction and Y direction. The mask 2 and the work 5 are connected by the connection pantograph 66 which has the fulcrum 66a and joint 66b which are driven at the ratio of a/b.

In the above construction, this mask 2 or work 5 are driven at the speed rate of a/b. Therefore, the laser machining apparatus of the embodiment can machine the work 5 having a large area using small laser beam.

What is claimed is:

1. A laser machining apparatus which comprises a mask having light transmitting portions which allow a laser light received from a light source to pass through and reflecting portions which reflect said laser light, and a reflecting mirror, mounted substantially in parallel with said mask and separated by a predetermined distance from said mask, which causes the laser light received from the reflecting portions of the mask to reflect toward said mask, and an imaging optical system, for machining a work by laser light which passes through the light transmitting portions of the mask, the laser machining apparatus comprising:

means for causing said mask to move in parallel with said work for machining the work.

2. A laser light machining apparatus according to claim 1, wherein said reflecting mirror mounted at opposite side of the mask is a cylindrical concave mirror.

3. A laser light machining apparatus according to claim 1, wherein said reflecting mirror mounted at opposite side of the mask is a spherical concave mirror.

4. A laser machining apparatus which comprises a mask having light transmitting portions which allow a laser light received from a light source to pass through and reflecting portions which reflect said laser light, a reflecting mirror, mounted substantially in parallel with said mask and separated by a predetermined distance from said mask, which causes the laser light received from the reflecting portions to reflect toward said mask, and an imaging optical system, for machining a work by laser light which passes through the light transmitting portions of the mask, the laser machining apparatus comprising:
   means for causing said work to move in parallel with said mask for machining the work.

5. A laser light machining apparatus according to claim 4, wherein said reflecting mirror mounted at opposite side of the mask is a cylindrical concave mirror.

6. A laser light machining apparatus according to claim 4, wherein said reflecting mirror mounted at opposite side of the mask is a spherical concave mirror.

7. A laser machining apparatus which comprises a mask having light transmitting portions which allow a laser light received from a light source to pass through and reflecting portions which reflect said laser light, a reflecting mirror, mounted substantially in parallel with said mask and separated by a predetermined distance from said mask, which causes the laser light received from the reflecting portions to reflect toward said mask, and an imaging optical system, for machining a work by laser light which passes through the light transmitting portions of the mask, the laser machining apparatus comprising:
   means for causing said mask and said work to move synchronously and in parallel to each other for machining the work.

8. A laser light machining apparatus according to claim 7, wherein said reflecting mirror mounted at opposite side of the mask is a cylindrical concave mirror.

9. A laser light machining apparatus according to claim 7, wherein said reflecting mirror mounted at opposite side of the mask is a spherical concave mirror.

10. A laser machining apparatus which comprises a mask having light transmitting portions which allow a laser light received from a light source to pass through and reflecting portions which reflect said laser light, a reflecting mirror, mounted substantially in parallel with said mask and separated by a predetermined distance from said mask, which causes the laser light received from the reflecting portions to reflect toward said mask, and an imaging optical system, for machining a work by laser light which passes through the light transmitting portions of the mask, the laser machining apparatus comprising:
   means for causing a multiple reflection optical system comprised of the mask and the reflecting mirror and an imaging optical system to move in parallel to each other for machining the work.

11. A laser machining apparatus which comprises a mask having light transmitting portions which allow a laser light received from a light source to pass through and reflecting portions which reflect said laser light, a reflecting mirror, mounted substantially in parallel with said mask and separated by a predetermined distance from said mask, which causes the laser light received from the reflecting portions to reflect toward said mask, and an imaging optical system, for machining a work by laser light which passes through the light transmitting portions of the mask, the laser machining apparatus for maintaining the light intensity to be constant comprising:
   a moving means for causing the mask to move in parallel with the work;
   a measuring means mounted at the opposite side of the mask for measuring the light intensity of the laser light irradiated on the reflecting mirror via the mask;
   an angle regulating means for regulating the angle between the reflecting mirror and the mask;
   a controlling means for controlling said angle regulating means in response to said light intensity.

12. A laser machining apparatus comprising:
   a mask which has transmitting portions which allow laser light from light source to pass through and reflecting portions which reflect the laser light from the light source;
   an imaging optical system which causes the mask pattern to image on a work surface which is in the same plane of the mask surface.

13. A laser machining apparatus according to claim 12, further comprising:
   a platform on which the mask and the work are located in the same plane.

14. A laser machining apparatus according to claim 13, further comprising:
   a first driving means for causing said platform to drive around the first rotating axis which is perpendicular to the platform plane.

15. A laser machining apparatus according to claim 14 further comprising:
   a second driving means for causing said platform to move fore and aft along a second axis which is perpendicular to the first rotating axis.

16. A laser machining apparatus, comprising:
   a mask which has transmitting portions which allow laser light from light source to pass through and reflecting portions which reflect the laser light from the light source;
   a first X-Y stage for placing the mask thereon;
   a second X-Y stage which is located in the same plane where the first X-Y stage is located for placing work thereon;
   an imaging optical system which causes the laser light passed through said transmitting portions of the mask to image in the same plane where the mask is located.

17. A laser machining apparatus comprising:
   a mask which has transmitting portions which allow laser light from light source to pass through and reflecting portions which reflect the laser light from the light source;
   a connection pantograph which holds the mask and the work in parallel at a distance in the same plane;
   an imaging optical system which causes the laser light passed through said transmitting protions of the mask to image in the plane where the mask is located.

* * * * *